United States Patent
Isler et al.

(10) Patent No.: US 9,203,016 B2
(45) Date of Patent: Dec. 1, 2015

(54) MANUFACTURING MAGNETIC SENSOR ELEMENTS MONOLITHICALLY INTEGRATED AT A SEMICONDUCTOR CHIP COMPRISING AN INTEGRATED CIRCUIT

(71) Applicant: NXP B.V., Eindhoven (NL)

(72) Inventors: Mark Isler, Hamburg (DE); Frederik Willem Maurits Vanhelmont, Maaseik (BE)

(73) Assignee: NXP B.V., Eindhoven (NL)

( * ) Notice: Subject to any disclaimer, the term of this patent is extended or adjusted under 35 U.S.C. 154(b) by 51 days.

(21) Appl. No.: 14/272,893

(22) Filed: May 8, 2014

(65) Prior Publication Data

US 2014/0367815 A1   Dec. 18, 2014

(30) Foreign Application Priority Data

Jun. 12, 2013 (EP) .................................... 13171756

(51) Int. Cl.
| | |
|---|---|
| *H01L 43/12* | (2006.01) |
| *G01R 33/00* | (2006.01) |
| *G01R 33/09* | (2006.01) |
| *H01L 43/02* | (2006.01) |

(52) U.S. Cl.
CPC ............ *H01L 43/12* (2013.01); *G01R 33/0052* (2013.01); *G01R 33/09* (2013.01); *H01L 43/02* (2013.01)

(58) Field of Classification Search
CPC .... H01L 43/12; H01L 43/02; G01R 33/0052; G01R 33/09
USPC ......................................................... 257/427
See application file for complete search history.

(56) References Cited

U.S. PATENT DOCUMENTS

| 5,861,328 A | 1/1999 | Tehrani et al. |
| 6,048,739 A | 4/2000 | Hurst et al. |

(Continued)

FOREIGN PATENT DOCUMENTS

DE    10 2005 047 414 A1    8/2006

OTHER PUBLICATIONS

Extended European Search Report for EP Patent Appln. No. 13171756.3 (Nov. 25, 2013).

*Primary Examiner* — Karen Kusumakar
*Assistant Examiner* — Adam S Bowen

(57) ABSTRACT

A method is described for manufacturing a magnetic sensor module (100, 200, 300, 400) having magnetic sensor elements (130, 330, 430) monolithically integrated at a semiconductor chip (110) which comprises an integrated circuit. The described method comprises (a) providing a composite semiconductor arrangement (105) comprising (i) the semiconductor chip (110), (ii) contact elements (112) for the integrated circuit, which are formed on the semiconductor chip (110), and (iii) a dielectric layer (120) formed over the semiconductor chip (110) and over the contact elements (112), (b) forming a magnetic sensor layer providing the material for the magnetic sensor elements (130, 330, 430) monolithically over the dielectric layer (120), (c) exposing the contact elements (112) by removing a part of the dielectric layer (120) which part is located above the contact elements (112), and (d) forming an electric conductive protection layer (140, 240, 340, 440) over either the formed magnetic sensor layer or the exposed contact elements (112) in order to prevent negative interactions between (i) the step of forming the magnetic sensor elements (130, 330, 430) resulting from the magnetic sensor layer and (ii) the step of exposing the contacting elements (112). It is further described a magnetic sensor module (100, 200, 300, 400) which is manufactured by the above described method.

15 Claims, 18 Drawing Sheets

(56) References Cited

U.S. PATENT DOCUMENTS

| | | |
|---|---|---|
| 6,850,057 B2 | 2/2005 | Witcraft et al. |
| 7,449,882 B2 | 11/2008 | Witcraft et al. |
| 8,564,287 B2 | 10/2013 | Vanhelmont et al. |
| 2006/0202291 A1 | 9/2006 | Kolb et al. |
| 2009/0243607 A1* | 10/2009 | Mather ............... B82Y 25/00 324/249 |
| 2011/0187361 A1* | 8/2011 | Vanhelmont ........ B82Y 25/00 324/252 |

* cited by examiner

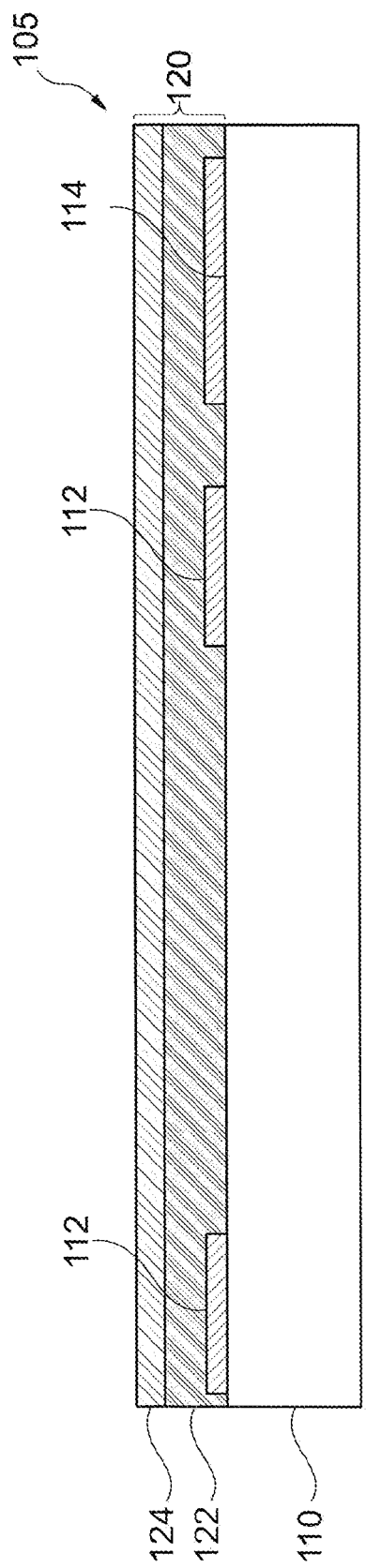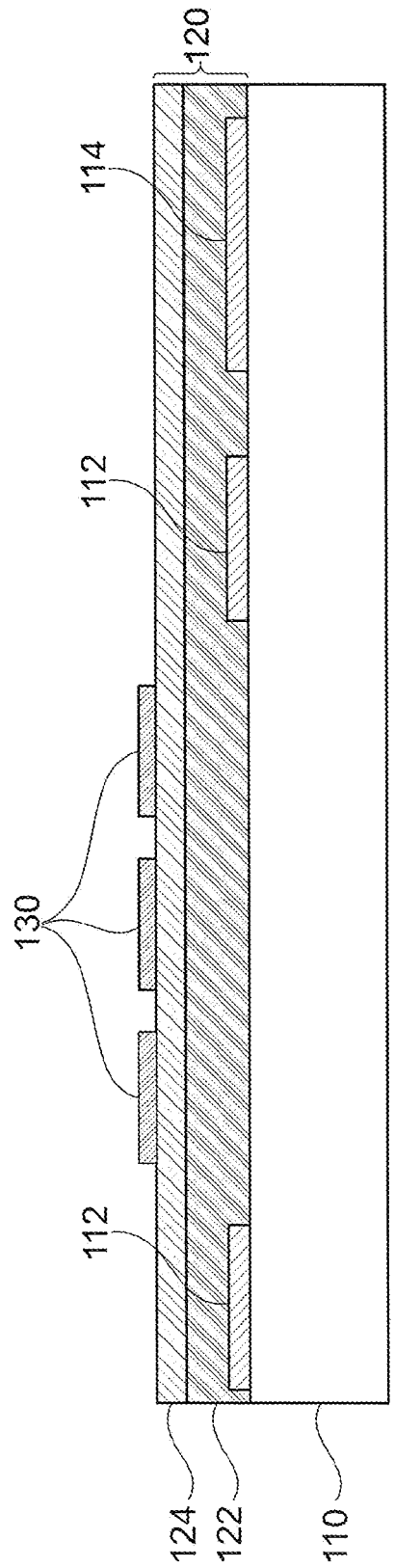

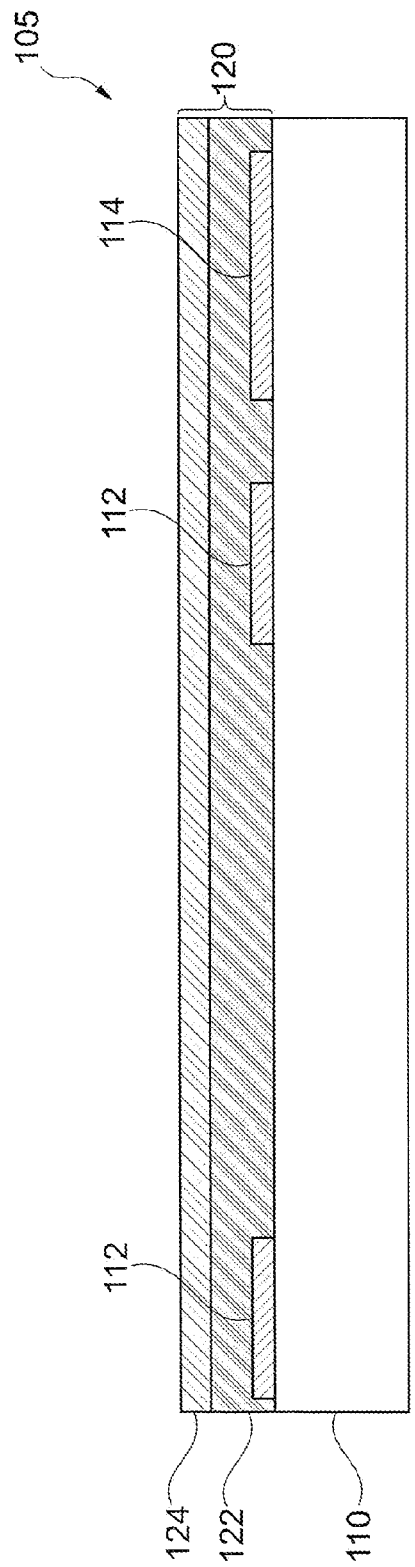
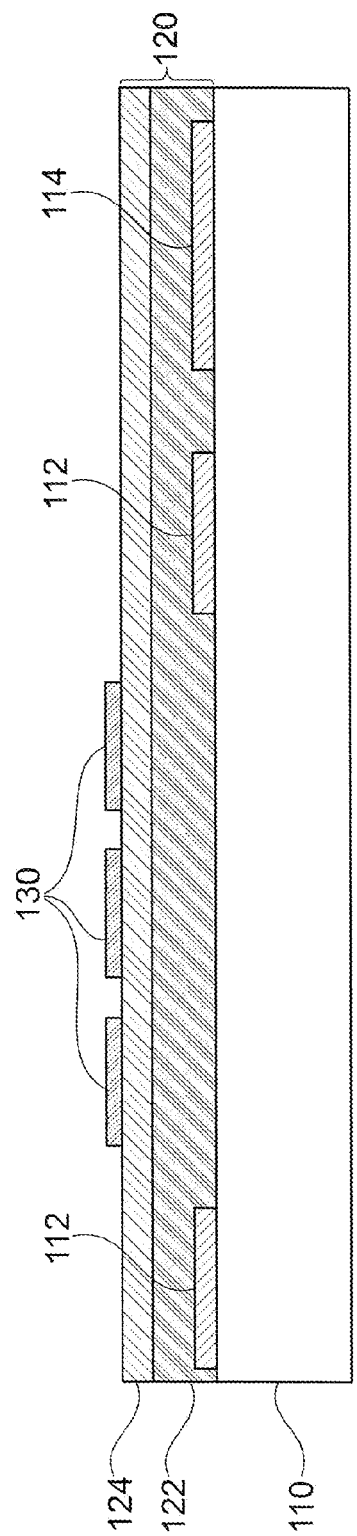
Fig. 2a
Fig. 2b

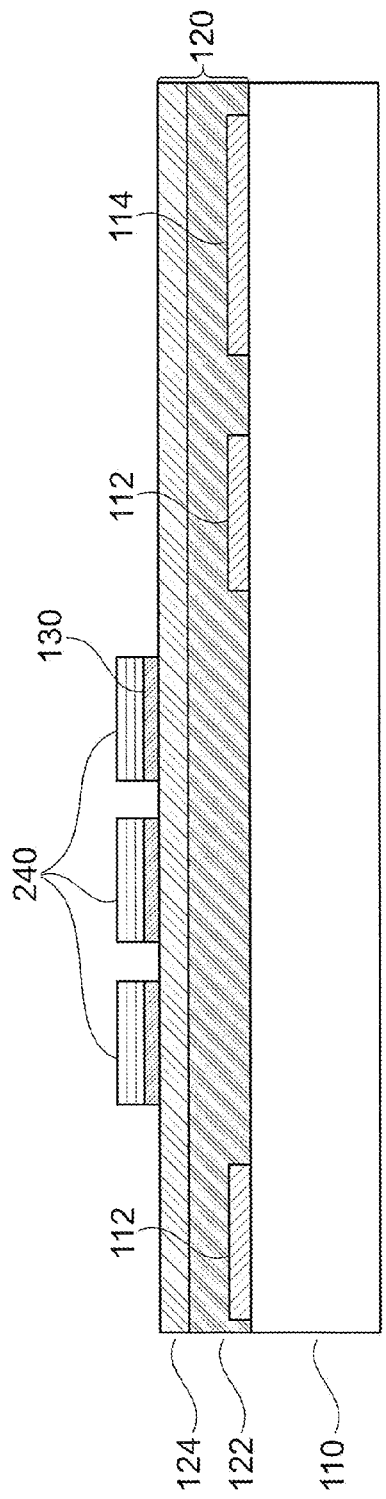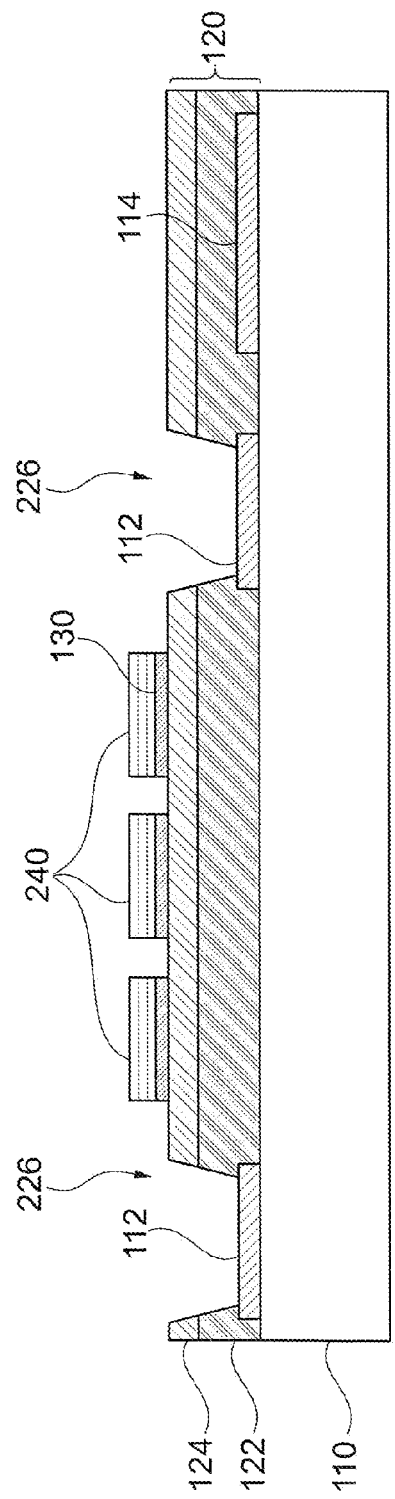

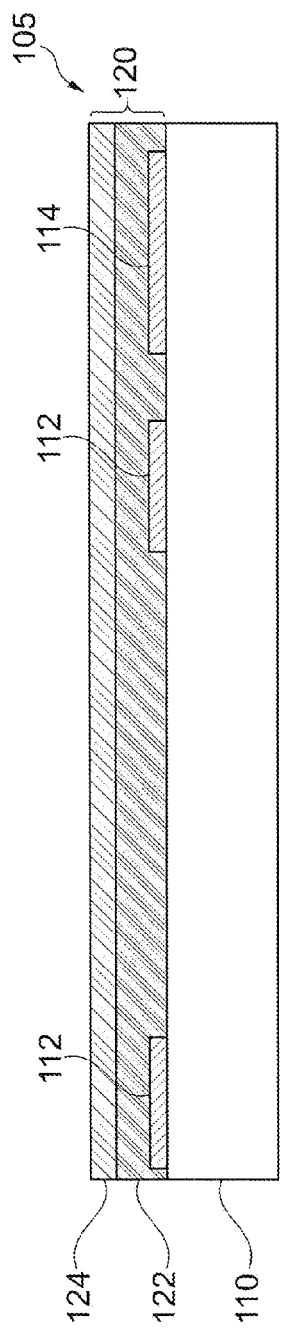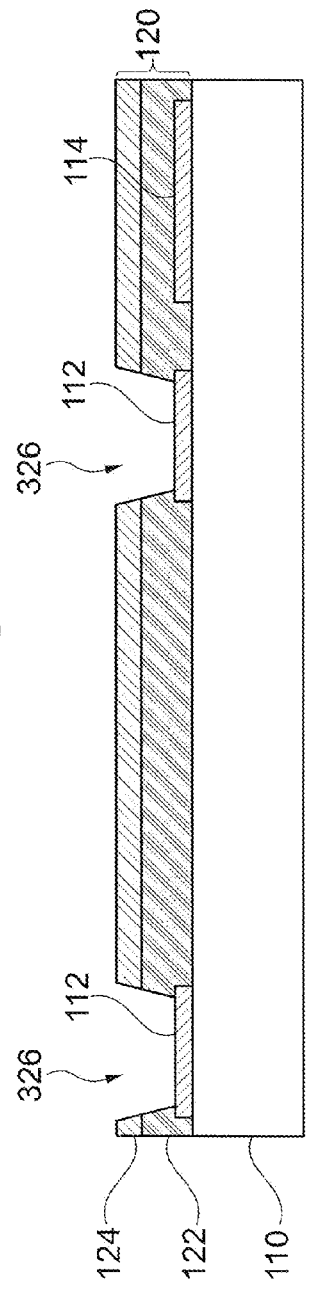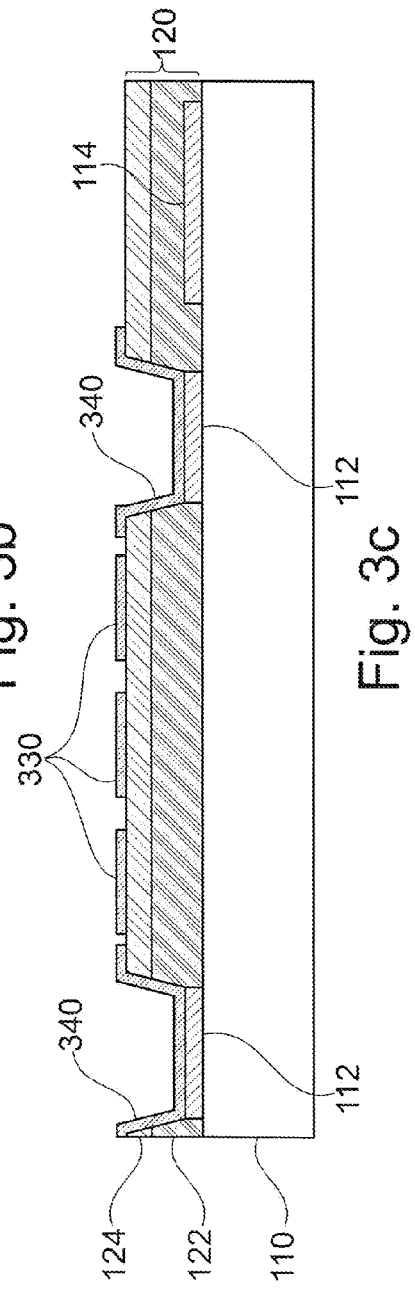

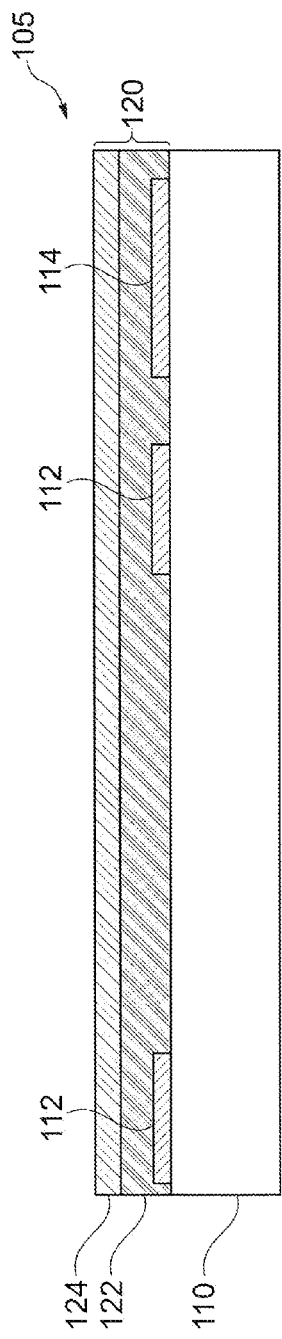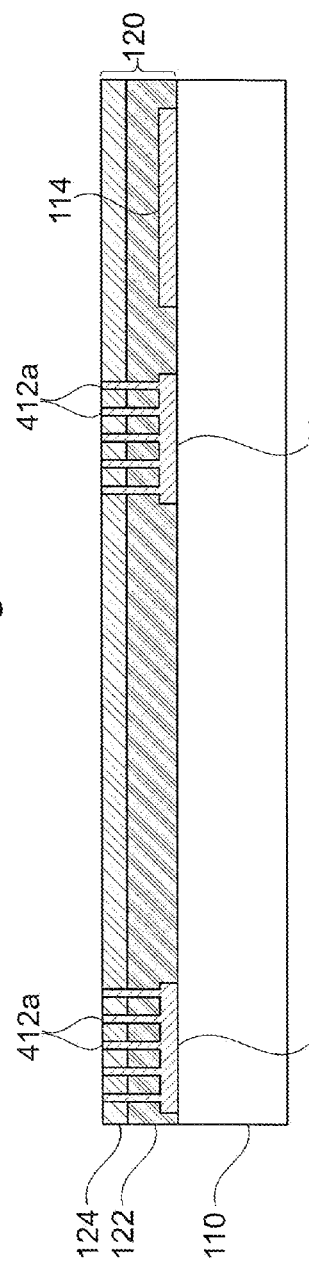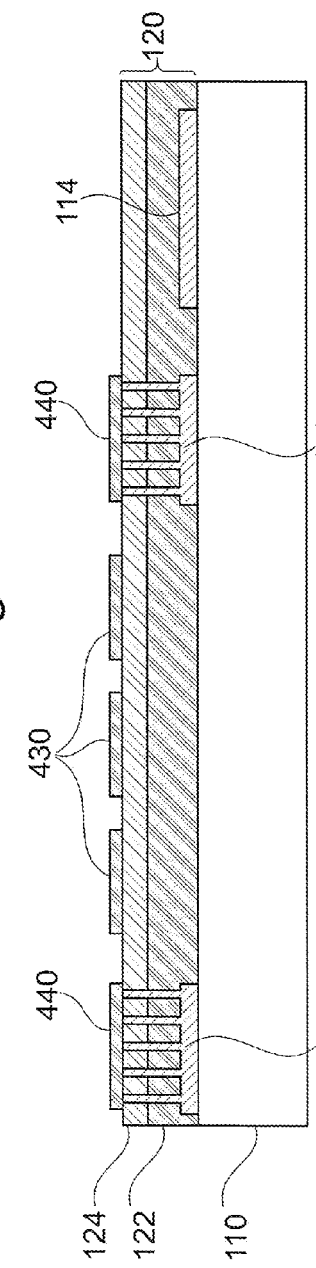

MANUFACTURING MAGNETIC SENSOR ELEMENTS MONOLITHICALLY INTEGRATED AT A SEMICONDUCTOR CHIP COMPRISING AN INTEGRATED CIRCUIT

CROSS-REFERENCE TO RELATED APPLICATIONS

This application claims the priority under 35 U.S.C. §119 of European patent application no. 13171756.3, filed on Jun. 12, 2013, the contents of which are incorporated by reference herein.

FIELD OF THE INVENTION

The present invention generally relates to the technical field of magnetic sensor modules comprising magnetic sensor elements which are monolithically integrated at an active semiconductor chip comprising an integrated circuit. In particular, the present invention related to a method for manufacturing such a magnetic sensor module and to a magnetic sensor module which has been manufactured by such a method.

BACKGROUND OF THE INVENTION

Magnetic sensors are increasingly important in various industries. For instance in the automotive industry various sensors such as parking sensors, angular sensors e.g. in throttle valves, ABS (Anti-lock Braking System) sensors and tire pressure sensors can be found in modern vehicles for improving comfort and safety. Magnetic sensors are particularly important in automotive applications, because magnetic fields penetrate easily through most materials. Unlike for example optical sensors, magnetic sensors are also highly insensitive to dirt.

Several different magnetic sensor technologies are currently available, such as sensors based on the Hall Effect and sensors based on the magnetoresistive effect such as anisotropic magnetoresistive (AMR), tunnel magnetoresistive (TMR) and giant magnetoresistive (GMR) sensors.

For the next generation of magnetic automotive sensors the structures of corresponding magnetic elements are planned to be monolithically integrated on top of active silicon (i.e. a semiconductor chip having implemented an integrated circuit) in order to reduce packaging costs, to reduce the number of bond pads and to make a matching of magnetic/electrical elements easier/more accurate. This integration requires a new processing route for the magnetic sensor elements on the top metal layer of an integrated circuit e.g. in a CMOS back-end process.

In case of a magnetic sensor module relying on the AMR effect the magnetic sensor elements are made from a permalloy material which is a nickel-iron magnetic alloy with about 20% iron content and 80% nickel content. Interconnects are required to connect the magnetic sensor elements consisting of thin permalloy stripes to the underlying integrated circuit. The main challenge for a monolithic integration is to perform the patterning of the permalloy stripes and the interconnect formation, which serve as the electric connection to the underlying active silicon (e.g. an application-specific integrated circuit (ASIC)) without damaging each other. Specifically, in case a magnetic sensor element patterning is performed before a formation of the interconnects, the magnetic sensor elements need to be prevented from any damage during the process of exposing of the interconnects. Vice versa, if the interconnect formation is performed before patterning of the magnetic sensor elements, the exposed metal of the interconnects must not be damaged by the permalloy patterning process.

Particularly, a microwave resist strip and a sidewall polymer removal step after etching of contact holes for forming the interconnects as well as a sputter etch before deposition of the contacting metal could damage the magnetic sensor elements if they are formed first. This is because the permalloy is exposed during these steps. Vice versa, a patterning of the magnetic sensor elements could damage the interconnect areas if they are formed at least partially before the magnetic sensor elements. Particularly, the exposed metal of the interconnects could be damaged either by an acid if the material of the magnetic sensor elements is etched wet or by an ion bombardment of a dry etch process.

There may be a need for providing an effective and reliable manufacturing procedure for a magnetic sensor module having magnetic sensor elements monolithically integrated at or on a semiconductor chip such that the risk of damaging either magnetic sensor elements or interconnects is significantly reduced.

OBJECT AND SUMMARY OF THE INVENTION

This need may be met by the subject matter according to the independent claims. Advantageous embodiments of the present invention are described by the dependent claims.

According to a first aspect of the invention there is provided a method for manufacturing a magnetic sensor module having magnetic sensor elements monolithically integrated at or preferably on a semiconductor chip which comprises an integrated circuit. The provided method comprises (a) providing a composite semiconductor arrangement comprising (i) the semiconductor chip, (ii) contact elements for the integrated circuit, which are formed on the semiconductor chip, and (iii) a dielectric layer formed over the semiconductor chip and over the contact elements, (b) forming a magnetic sensor layer providing the material for the magnetic sensor elements monolithically over the dielectric layer, (c) exposing the contact elements by removing a part of the dielectric layer which part is located above the contact elements, and (d) forming an electric conductive protection layer over either the formed magnetic sensor layer or the exposed contact elements in order to prevent negative interactions between (i) the step of forming the magnetic sensor elements resulting from the magnetic sensor layer and (ii) the step of exposing the contacting elements.

The described manufacturing method is based on the idea that by forming the electric conductive protection layer either over the formed magnetic sensor layer or over the exposed contact elements a damage of one of (i) the formed magnetic sensor layer and (ii) the exposed contact elements can be effectively prevented when the other one of the magnetic sensor elements and the contact elements is formed or exposed, respectively.

Specifically, after the electric conductive protection layer has been formed over the magnetic sensor layer the contact elements can be exposed without the risk of damaging the magnetic sensor layer. Alternatively, after the electric conductive protection layer has been formed over the exposed contact elements the formation of the magnetic sensor elements cannot lead to a damage of the exposed contact elements.

It is noted that it is not necessary that the mentioned steps (a) to (d) are performed in the described order. In particular, it is possible to reverse the order of the mentioned steps (b) and (c) such that step (c) is carried out prior to step (b).

The described manufacturing method may provide the advantage that using the electric conductive protection layer does not require any additional mask layer which keeps process complexity and manufacturing costs at a minimum level.

The described manufacturing method may further provide the advantage that it works for different types of magnetic sensor concepts. Specifically, the magnetic sensor elements may be anisotropic magnetoresistive (AMR) sensor elements, giant magnetoresistive (GMR) sensor elements, or tunnel magnetoresistive (TMR) sensor elements.

The contact elements may be in particular used for electrically connecting the integrated circuit with the magnetic sensor elements. Therefore, the contact elements can also be denominated interconnection elements or short interconnects.

The contact elements may be made of any material which is suitable for being used in a semiconductor manufacturing process for interconnecting different electric parts of a composite semiconductor arrangement. Specifically, the contact elements may comprise at least one of the elements gold (Au), copper (Cu) and aluminum (Al).

In case of employing the well known AMR effect the magnetic sensor elements may be made of so called permalloy which is a nickel-iron magnetic alloy with about 20% iron content and 80% nickel content.

The magnetic sensor module may be a composite semiconductor arrangement which is formed monolithically. This means that a magnetic sensor arrangement of e.g. four magnetic sensor elements which may be interconnected with each other in a Wheatstone bridge is electrically connected with the semiconductor chip respectively with the integrated circuit of the semiconductor chip without an interconnection wiring such as e.g. bond wires. Instead of using a wired interconnection the contact elements of the integrated circuit are connected with the magnetic sensor arrangement by means of appropriately formed and structured electrical conductive layers.

The integrated circuit may represent a so called application-specific integrated circuit (ASIC). With an ASIC at least some of the functionalities of control and/or evaluation electronics for the magnetic sensor arrangement can be realized.

It should be noted that the term "over" or "above" does not necessarily mean that one element is directly arranged or disposed on another element, but also comprises that additional layers or elements are disposed between the two elements. For example, the meaning of the feature "forming the magnetic sensor elements monolithically over the dielectric layer", includes that the magnetic sensor element(s) are disposed directly on the dielectric layer and also includes that additional layer(s) are arranged between the magnetic sensor elements and the dielectric layer.

Further, it should be noted that in this document the term "over" or "above" are not necessarily used with reference to the force of gravity. Specifically, when the composite semiconductor arrangement is oriented upside down, for example, "above" can mean "below" and "over" can mean "under".

According to an embodiment of the invention the dielectric layer comprises a first dielectric sub-layer formed over the semiconductor chip and a second dielectric sub-layer formed over the first dielectric sub-layer.

Using two dielectric sub-layers for forming the dielectric layer may provide the advantage that on the one hand a good overall electric isolation between the magnetic sensor arrangement given by the magnetic sensor elements and the regions of the semiconductor chip which are outside from the contact elements can be realized. On the other hand a reduced mechanical stress between (i) the magnetic sensor elements and (ii) (the body of) the semiconductor chip can be realized.

The first dielectric sub-layer and/or the second dielectric sub-layer may be made of an oxide material such as e.g. a silicon oxide material.

According to a further embodiment of the invention the method further comprises (e) forming, in the regions above the exposed contact elements, an electric conductive barrier layer over the exposed contact elements and (f) forming, in the regions above the exposed contact elements, a contacting material over the electric conductive barrier layer. This may provide the advantage that an unwanted diffusion of atoms in particular between the contacting material and the contact elements can be avoided. Further, a good and reliable electric connection between the magnetic sensor elements on the one hand and the corresponding contact elements can be realized.

According to a further embodiment of the invention the method further comprises (g) forming, over the magnetic sensor elements and the contacting material, a nonmetallic passivation layer. This may provide the advantage that the resulting magnetic sensor module can be effectively protected from external environmental effects such as e.g. dust, dirt and/or humidity. The nonmetallic passivation layer may be realized e.g. by silicon nitride (SiN) or by silicon oxy nitride (SiON).

According to a further embodiment of the invention the method further comprises (h) exposing a bond pad which is provided at the surface of the semiconductor chip by removing, in the region above the bond pad, the passivation layer and the dielectric layer.

By exposing a least one bond pad being provided at the surface of the semiconductor chip the resulting magnetic sensor module comprising the magnetic sensor arrangement and a corresponding electronic circuitry can be easily contacted with other electronic devices in particular by means of one or more bond wires.

According to a further embodiment of the invention the electric conductive protection layer comprises at least one material of the group consisting of TiW, TiWN, Ta, TaN, Ti, TiN, W, WN or NiFe.

According to a further embodiment of the invention the step of forming the magnetic sensor layer is accomplished before the step of exposing the contact elements and the electric conductive protection layer is formed over the formed magnetic sensor layer. This may mean that the step of forming the electric conductive protection layer is accomplished after the magnetic sensor layer has been formed and before the contact elements have been exposed.

It is noted that in this context also a patterning or a structuring of the magnetic sensor elements from the magnetic sensor layer may be carried out before the step of exposing the contact elements.

According to a further embodiment of the invention the method further comprises forming the magnetic sensor elements by structuring the magnetic sensor layer. Further, the electric conductive protection layer is formed over the formed magnetic sensor elements and over the contact elements and the step of exposing the contact elements comprises removing, in the region above the contact elements, both the dielectric layer and the electric conductive protection layer. This may provide the advantage that when exposing the contact elements the before formed magnetic sensor elements will be fully encapsulated by the electric conductive protection layer. Specifically, not only the top surface of the magnetic sensor elements but also the side surface of the magnetic sensor elements will be protected when exposing the contact elements.

According to a further embodiment of the invention before exposing the contact elements the electric conductive protection layer is structured by removing the electric conductive protection layer in all regions except the regions above the areas in which the magnetic sensor elements have been formed or will be formed.

Thereby, the magnetic sensor layer may have been structured by using an appropriate mask in order to form the magnetic sensor elements before the electric conductive protection layer is structured preferably by using the same mask.

According to a further embodiment of the invention the electric conductive protection layer is formed over the formed magnetic sensor layer, which has not yet been structured in order to form the magnetic sensor elements. Further, the structured electric conductive protection layer is used as a hardmask for removing the magnetic sensor layer outside the areas of the magnetic sensor elements.

This may provide the advantage that together with structuring the electric conductive protection layer within one common structuring step also the magnetic sensor layer can be structured in the same way in order to form also the magnetic sensor elements. Since the structured electric conductive protection layer is used as a mask which is automatically correctly positioned the described procedure will be very reliable.

According to a further embodiment of the invention the step of exposing the contact elements is accomplished before the step of forming the magnetic sensor elements and the electric conductive protection layer is formed over the exposed contact elements. This may mean that the step of forming the electric conductive protection layer is accomplished after the contact elements have been exposed and before the magnetic sensor elements have been formed.

According to a further embodiment of the invention the material of the electric conductive protection layer is the same as the material of the magnetic sensor elements. This may provide the advantage that within one common deposition step and a subsequent patterning step the magnetic sensor elements and the electric conductive protection layer can be formed. As a consequence, with the described method a magnetic sensor module having magnetic sensor elements which are monolithically integrated at an active semiconductor chip can be realized in an effective manner.

According to a further embodiment of the invention the step of exposing the contact elements is accomplished by removing, in the regions above the contact elements, the dielectric layer. This may provide the advantage that for exposing the contact elements only the dielectric layer over the contact elements has to be removed e.g. by etching the dielectric material. There is no need to remove also material of the electric conductive protection layer respectively material of the magnetic sensor elements which will be deposited after the contact elements have been exposed completely.

According to a further embodiment of the invention the step of exposing the contact elements is accomplished by forming, in the regions above the contact elements, vias through the dielectric layer and filling the vias with a conductive material.

By filling the formed vias, plugs are formed in order to extend or raise the contact elements up to a level which corresponds to an upper surface of the dielectric layer. As a consequence, for contacting the contact elements located at the upper surface of the semiconductor chip there is no need to expose or to excavate the contact elements by removing all dielectric material being located above the contact elements.

The conductive material being used for filling the vias may be e.g. tungsten (W).

According to a further aspect of the invention there is provided a magnetic sensor module comprising (a) a semiconductor chip which accommodates an integrated circuit, (b) contact elements for the integrated circuit, which are formed on the semiconductor chip, (c) a dielectric layer formed over the semiconductor chip at least at regions being located outside from regions being located above the contact elements, and (d) magnetic sensor elements which are formed monolithically integrated over the dielectric layer. The magnetic sensor module is manufactured by any one of the exemplary methods as elucidated above.

The described magnetic sensor module is based on the idea that it can be effectively and reliably manufactured by carrying out the above described method. Specifically, by forming the electric conductive protection layer either over the formed magnetic sensor elements or over the exposed contact elements a damage of one of (i) the formed magnetic sensor elements and (ii) the exposed contact elements can be effectively prevented when the other one of the magnetic sensor elements and the contact elements is formed or exposed, respectively.

It has to be noted that embodiments of the invention have been described with reference to different subject matters. In particular, some embodiments have been described with reference to method type claims whereas another embodiment has been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claim is considered as to be disclosed with this application.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

FIGS. 1a to 1g illustrate in accordance with a first variant of a first embodiment of the invention the manufacturing of a magnetic sensor module, wherein before contact elements for an integrated circuit are exposed magnetic sensor elements are formed by structuring a corresponding layer of a permalloy material.

FIGS. 2a to 2g illustrate the manufacturing of a magnetic sensor module according to a second variant of the first embodiment of the invention.

FIGS. 3a to 3f illustrate in accordance with a first variant of a second embodiment of the invention the manufacturing of a magnetic sensor module, wherein before magnetic sensor elements are formed by structuring a corresponding layer of a permalloy, material contact elements for an integrated circuit are exposed.

FIGS. 4a to 4f illustrate the manufacturing of a magnetic sensor module according to a second variant of the second embodiment of the invention.

DESCRIPTION OF EMBODIMENTS

Figure 1C:
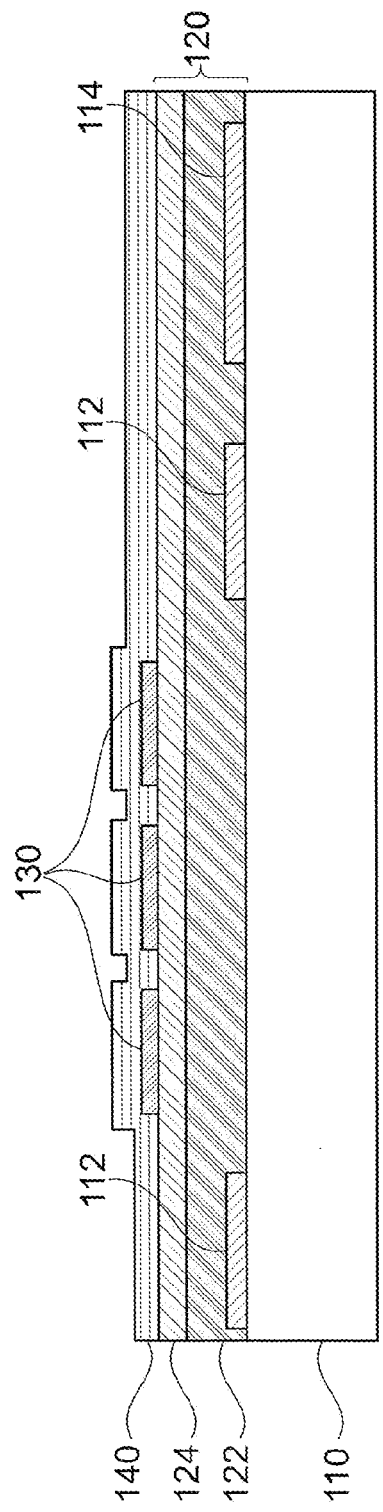

The illustration in the drawing is schematically. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

In the following detailed description there are described with reference to FIGS. 1a to 1g and FIGS. 2a to 2g two variants of a first embodiment of the invention. In accordance with both variants of the first embodiment before contact elements for an integrated circuit are exposed magnetic sensor elements are formed by structuring a corresponding layer of a permalloy material.

Specifically, in accordance with both variants of the first embodiment an electric conductive protection layer protects the permalloy during the formation of interconnects and serves as an adhesion layer and as a diffusion barrier between the permalloy and a contacting metallization. After patterning of the contacting metallization this electric conductive protection layer is at least partially removed above the active magnetic sensor elements using the contacting metallization as hardmask thereby avoiding any additional mask layer. The removal of the electric conductive protection layer above the active magnetic sensor elements is required because otherwise the active magnetic sensor elements would be short-circuited by the electric conductive protection layer. The electric conductive protection layer remains only below the contacting metallization. The electric conductive protection layer may consist of materials like TiW, TiWN, Ta, TaN, Ti, TiN, W or WN or combinations thereof.

If for the electric conductive protection layer and the diffusion barrier the same material is used, no additional manufacturing steps except for the deposition of the electric conductive protection layer are required. In this document the corresponding process flow is called the first variant of the first embodiment and is illustrated with reference to FIGS. 1a to 1g.

According to the second variant of the first embodiment this additional diffusion barrier/electric conductive protection layer is used as a hardmask for dry (or wet) etching of the permalloy which is not removed after permalloy patterning, but after (or during) the patterning of the contacting metallization. The corresponding process flow of this second variant of the first embodiment is illustrated with reference to FIGS. 2a to 2g.

FIG. 1a shows a composite semiconductor arrangement 105, which represents the starting basis for the method for manufacturing a magnetic sensor module according to the first variant of the first embodiment. The composite semiconductor arrangement 105 comprises (i) a semiconductor chip 110 accommodating a prefabricated ASIC (application specific integrated circuit) of the magnetic sensor module, (ii) contact elements 112 for the integrated circuit, which are formed on the semiconductor chip 110, and (iii) a dielectric layer 120 formed over the semiconductor chip 110 and over the contact elements 112. The composite semiconductor arrangement 105 further comprises a bond pad 114, which can be used, as will become apparent from the below description, for electrically contacting the magnetic sensor module with not depicted other electronic devices in particular by means of one or more bond wires.

According to the embodiment described here the dielectric layer 120 comprises two sub-layers, a first dielectric sub-layer 122 and a second dielectric sub-layer 124.

FIG. 1b shows a next processing state for manufacturing a magnetic sensor module, wherein magnetic sensor elements 130 have been formed over the second dielectric sub-layer 124. The formation of the magnetic sensor elements 130 may be accomplished in a known and non depicted manner by (a) a deposition of a layer of a permalloy material over the second dielectric sub-layer 124, (b) a deposition of a photoresist material on top of the deposited permalloy material layer, (c) a structuring of the photoresist material, (d) a dry or wet patterning of the permalloy material, and (e) a stripping of the remaining photoresist material.

FIG. 1c shows a next processing state, wherein an electric conductive protection layer 140 has been deposited over the magnetic sensor elements 130, the bond pad 114 and the surrounding regions of the second dielectric sub-layer 124. The electric conductive protection layer 140 may be made e.g. from the material TiW or any other material mentioned above.

Figure 1D:
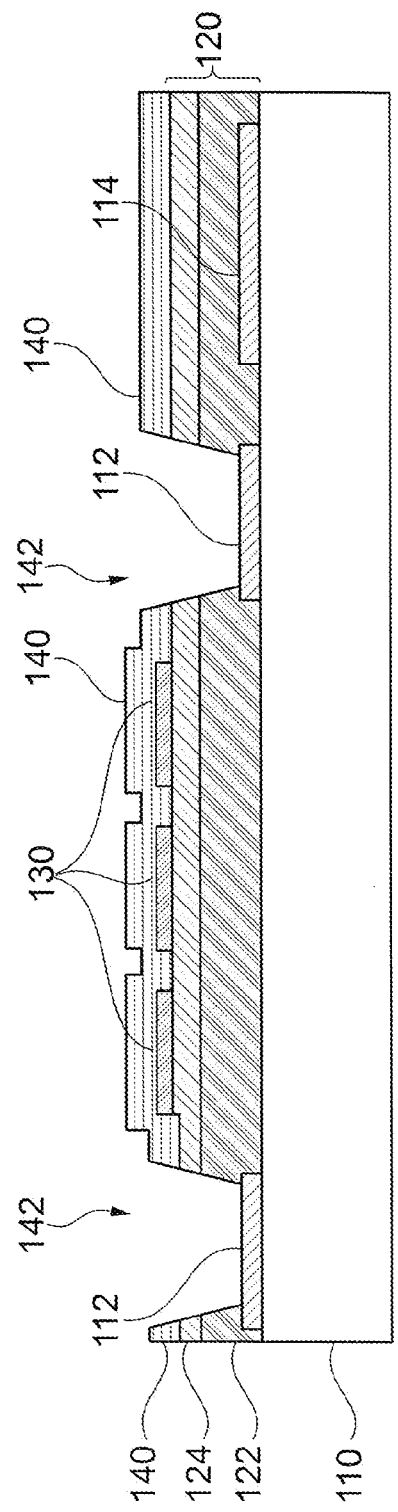

In a next processing state shown in FIG. 1d, recesses 142 for the contact elements 112 have been formed. The formation of these recesses 142 may be accomplished in a non depicted manner by (a) a deposition of a photoresist material on top of the electric conductive protection layer 140, (b) a structuring of the deposited photoresist material, (c) an etching of the electric conductive protection layer 140, (d) an etching of the two dielectric sub-layers 122, 124, and (e) a stripping of the remaining photoresist material and a removal of sidewall polymers. During these steps the electric conductive protection layer 140 prevents that the permalloy material is attacked or damaged.

Figure 1E:
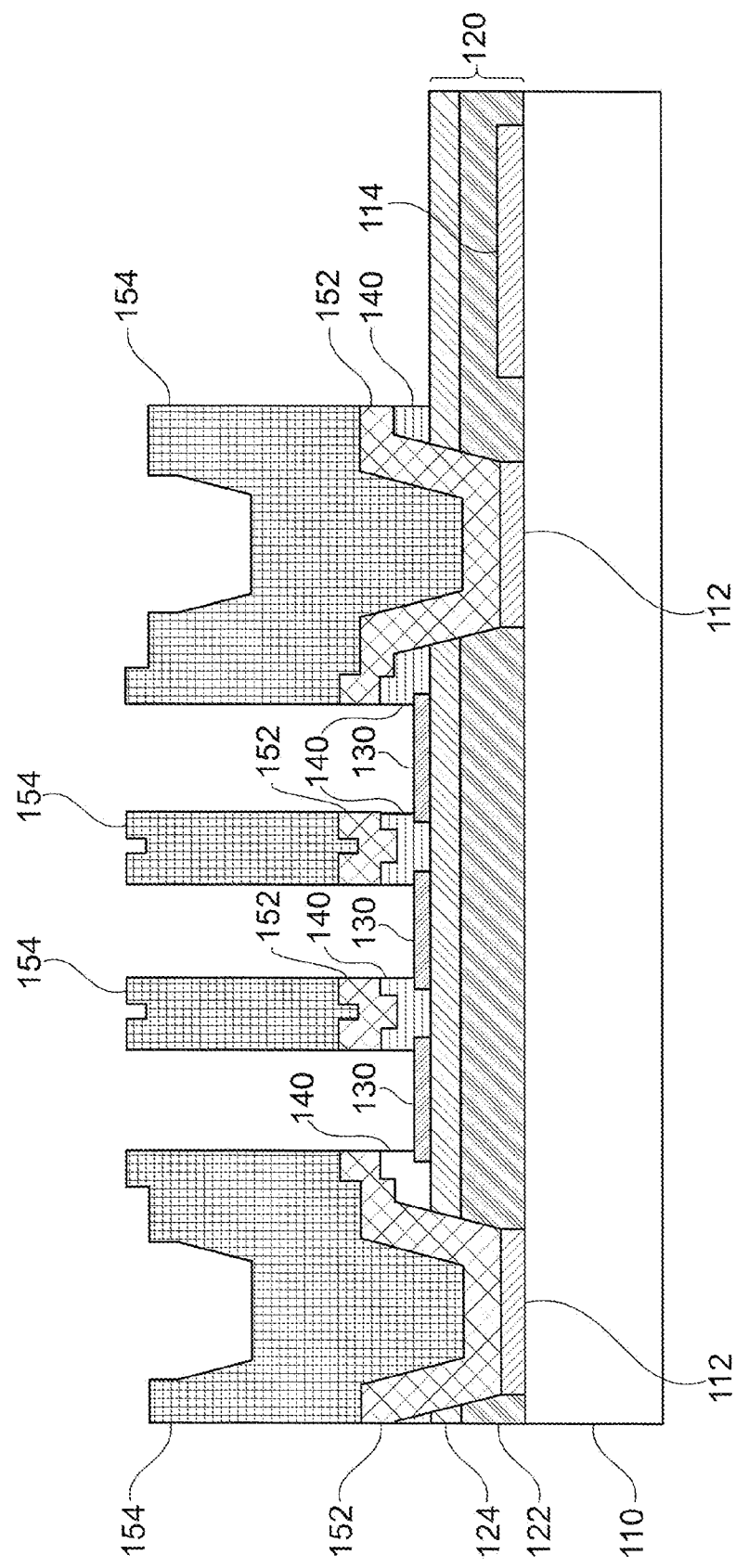

FIG. 1e shows a next processing state, wherein over the contact elements 112 and over the electric conductive protection layer 140 being located between two neighboring magnetic sensor elements 130 there has been formed first a metallic diffusion barrier layer 152 and a layer of contacting material 154. The formation of this structured arrangement may be accomplished in a non depicted manner by (a) a deposition of the diffusion barrier layer 152, (b) a deposition of the contacting material 154, (c) a deposition of a photoresist material on top of the contacting material 154, (d) a structuring of the deposited photoresist material, (e) an etching of the contacting material 154, (f) a stripping of the remaining photoresist material, (g) an etching of the diffusion barrier layer 152, and (h) an etching of the electric conductive protection layer 140 over the magnetic sensor elements 130. Due to the protection of the magnetic sensor elements 130 by means of the electric conductive protection layer 140 e.g. a sputter etch process can be used before step (a).

It is mentioned that the steps (g) and (h) can be combined in one single step. Further, for the etching in the steps (g) and (h) the before structured contacting material 154 can be used as a hardmask.

Figure 1F:
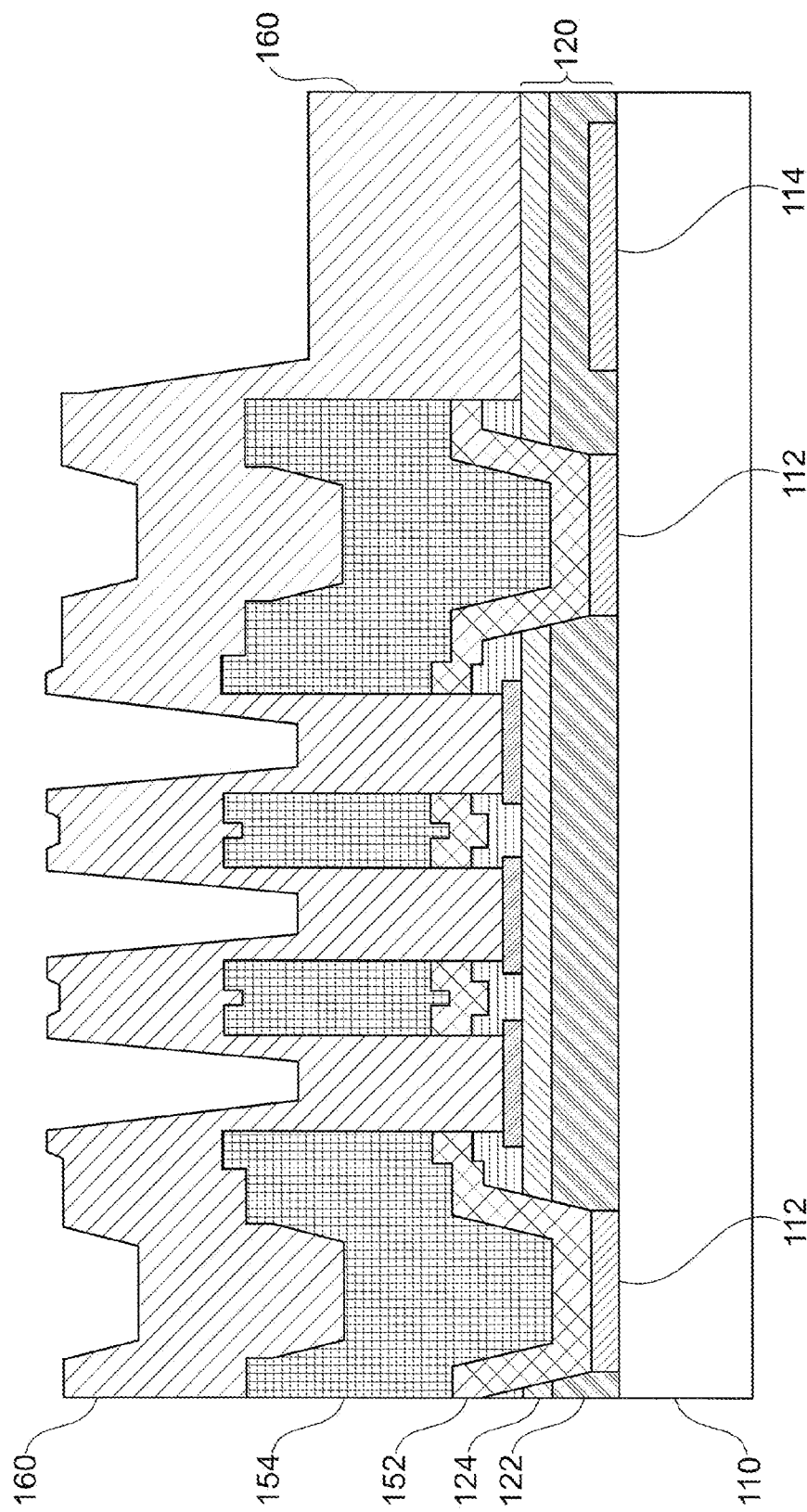

In a next processing state shown in FIG. 1f, a passivation layer 160 has been deposited. During, before and/or after the deposition of the passivation layer 160 the contact elements 112 may be annealed. The passivation layer 160, which may be made of e.g. silicon nitride (SiN) or silicon oxy nitride (SiON), can be formed in a known manner by means of e.g. a plasma deposition process (PECVD).

Figure 1G:
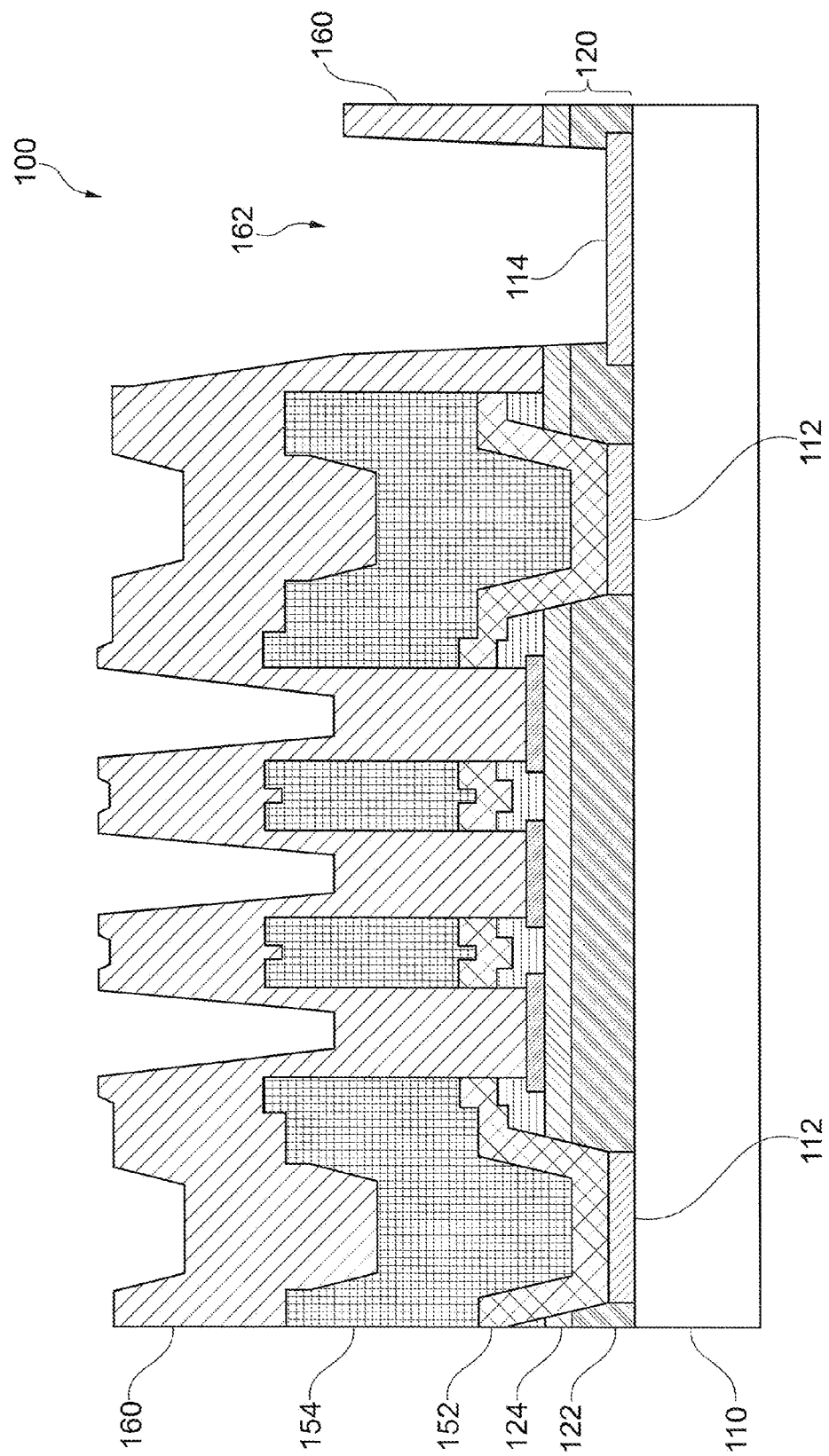

As can be seen from FIG. 1g, which shows the resulting magnetic sensor module 100, an opening or a recess 162 over the bond pad 114 has been formed. This opening or recess 162 allows the magnetic sensor module 100 to be electrically connected to other electronic devices e.g. by means of a bond wire. The formation of this opening or recess 162 may be accomplished in a non depicted manner by (a) a deposition of a photoresist material, (b) a structuring of the photoresist material, (c) an etching of the passivation layer 160 and the inter-metal dielectric layer 120, which according to the embodiment described here includes the first dielectric sub-layer 122 and the second dielectric sub-layer 124, and (d) a stripping of the photoresist material.

FIGS. 2a to 2g illustrate the manufacturing process of a magnetic sensor module in accordance with the second variant of the first embodiment.

As can be seen from FIGS. 2a and 2b, the corresponding processing states are the same as the processing states shown in FIGS. 1a and 1b, respectively. For the sake of conciseness these processing states will not be elucidated once again. Instead, reference is made to the description given above.

FIG. 2c shows a next processing state, wherein an electric conductive protection layer 240 is formed exclusively over the magnetic sensor elements 130. The formation of this structural arrangement may be accomplished in a non depicted manner by (a) a deposition of the electric conductive protection layer 240 e.g. made from TiW, (b) a deposition of a photoresist material onto the electric conductive protection layer 240, (c) an appropriate structuring of the photoresist material, (d) an etching of the electric conductive protection layer 240 such that only above the magnetic sensor elements 130 there remain parts of the electric conductive protection layer 240, and (e) a stripping of the remaining photoresist material.

It is mentioned that in order to realize the structural arrangement shown in FIG. 2c it is not necessary to separately etch the magnetic sensor elements 130 and the electric conductive protection layer 240. Instead, the processing state shown in FIG. 2b can be omitted and the electric conductive protection layer 240 and the AMR permalloy material for the magnetic sensor elements 130 can be etched consecutively or within one single etching step. In this way, the patterned or structured electric conductive protection layer can be used as a hardmask for etching the AMR permalloy material In a next processing state shown in FIG. 2d, recesses 226 for the contact elements 112 have been formed. The formation of these recesses 226 may be accomplished in a non depicted manner by (a) a deposition of a photoresist material, (b) a structuring of the deposited photoresist material, (c) an etching of the two dielectric sub-layers 122, 124, and (d) a stripping of the remaining photoresist material and a removal of sidewall polymers e.g. by means of microwave plasma. During these steps the electric conductive protection layer 240 prevents that the AMR permalloy material of the magnetic sensor elements 130 is attacked or damaged.

Figure 2E:
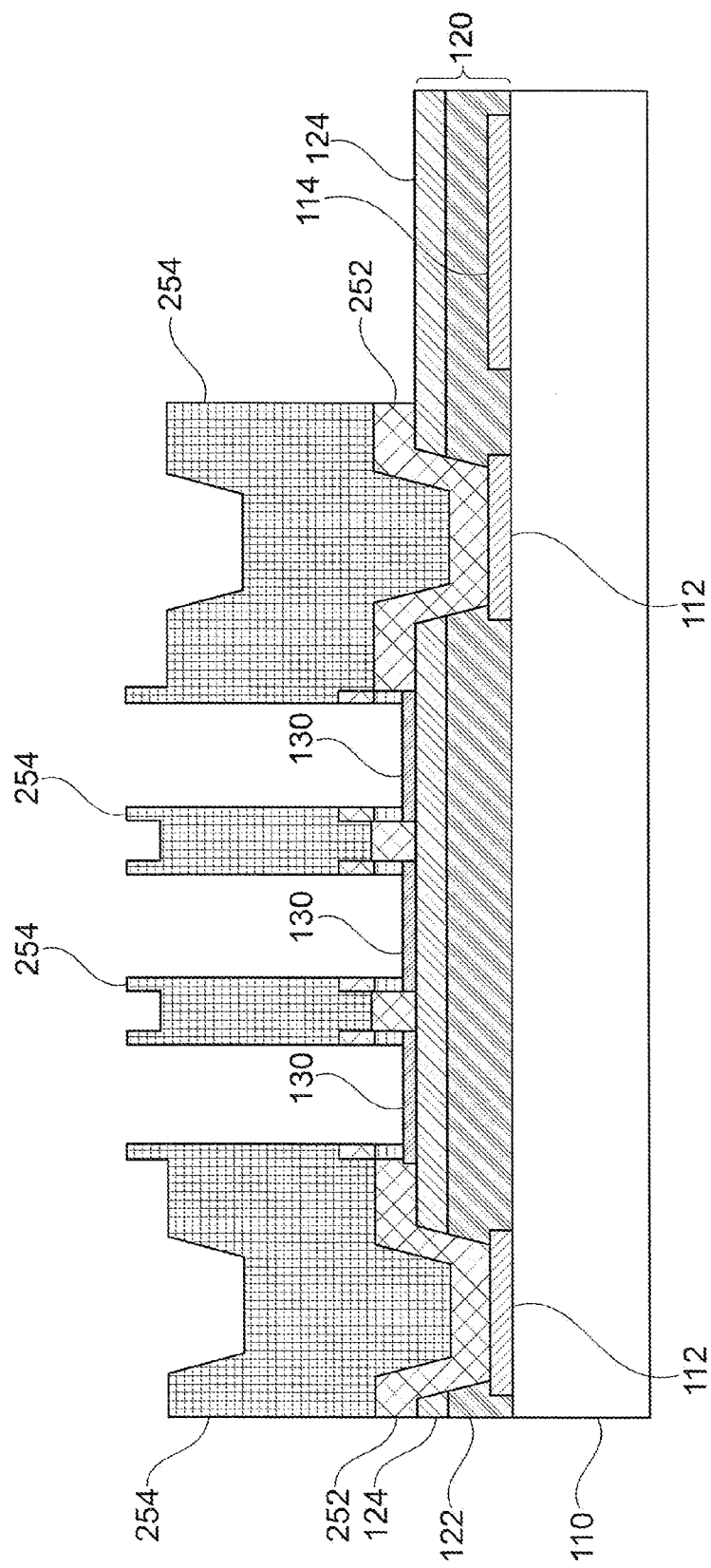

FIG. 2e shows a next processing state, wherein over the contact elements 112 and over the second dielectric sub-layer 124 in regions being located between two neighboring magnetic sensor elements 130 there has been formed first a metallic diffusion barrier layer 252 and a layer of contacting material 254. The formation of this structured arrangement may be accomplished in a non depicted manner by (a) a deposition of the diffusion barrier layer 252, (b) a deposition of the contacting material 254, (c) a deposition of a photoresist material on top of the contacting material 254, (d) a structuring of the deposited photoresist material, (e) an etching of the contacting material 254, (f) a stripping of the remaining photoresist material, (g) an etching of the diffusion barrier layer 152, and (h) an etching of the electric conductive protection layer 240 over the magnetic sensor elements 130. Due to the protection of the magnetic sensor elements 130 by means of the electric conductive protection layer 240 e.g. a sputter etch process can be used before step (a).

It is mentioned that the steps (g) and (h) can be combined in one single step. Further, for the etching in the steps (g) and (h) the before structured contacting material 254 can be used as a hardmask.

Figure 2F:
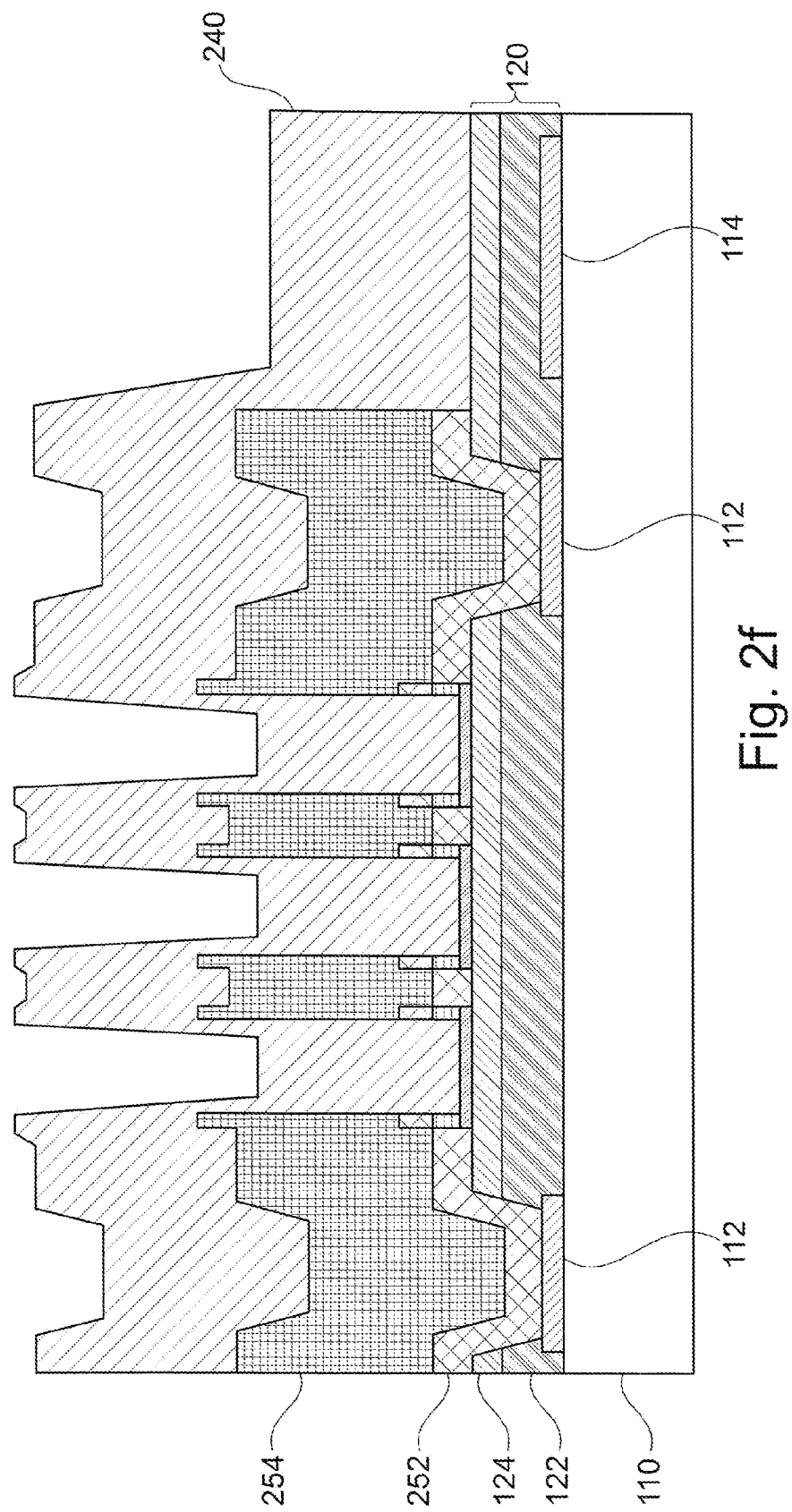

In a next processing state shown in FIG. 2f, a passivation layer 260 has been deposited. During, before and/or after the deposition of the passivation layer 260 the permalloy material of the magnetic sensor elements 130 may be annealed. The passivation layer 260, which may be made of e.g. silicon nitride (SiN) or silicon oxy nitride (SiON), can be formed in a known manner by means of e.g. a plasma deposition process.

Figure 2G:
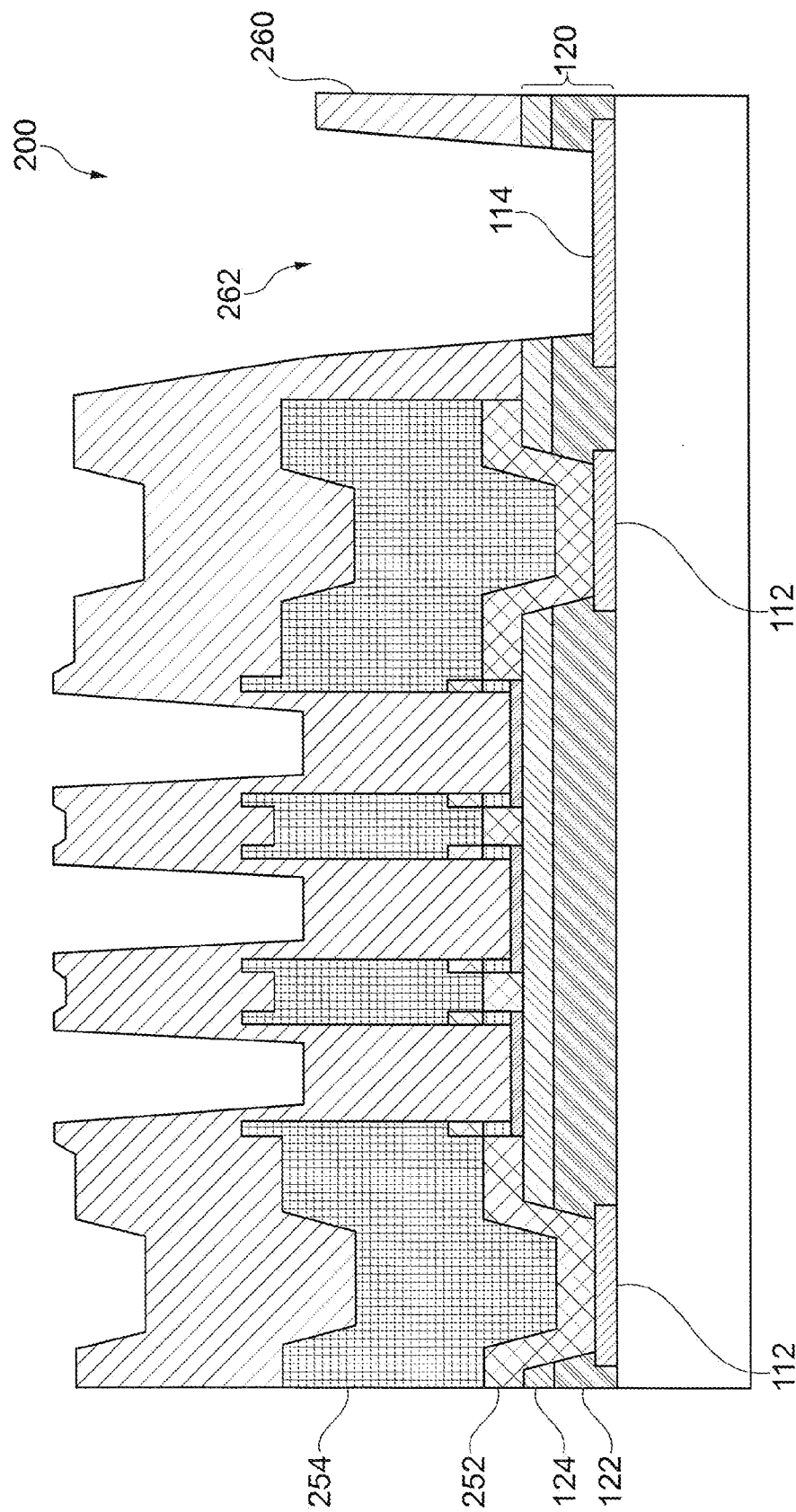

As can be seen from FIG. 2g, which shows the resulting magnetic sensor module 200, an opening or a recess 262 over the bond pad 114 has been formed. This opening or recess 262 allows the magnetic sensor module 200 to be electrically connected to other electronic devices e.g. by means of a bond wire. The formation of this opening or recess 262 may be accomplished in a non depicted manner by (a) a deposition of a photoresist material, (b) a structuring of the photoresist material, (c) an etching of the passivation layer 260 and of the inter-metal dielectric layer 120, which according to the embodiment described here includes the first dielectric sub-layer 122 and the second dielectric sub-layer 124, and (d) a stripping of the photoresist material.

FIGS. 3a to 3f and FIGS. 4a to 4f illustrate two variants of a second embodiment of the invention. In accordance with both variants of the second embodiment contact elements for an integrated circuit are exposed before magnetic sensor elements are formed by structuring a corresponding layer of a permalloy material. In this, descriptive speaking, "contact first" integration architecture the deposition of an electric conductive protection layer protects the exposed top metal of the ASIC in the contact holes during patterning of the permalloy. Thereby, the electric conductive protection layer is deposited within the contact holes. Preferably, the permalloy layer for the magnetic sensor elements itself is used as the electric conductive protection layer. This has the advantage that no additional manufacturing steps are required which keeps manufacturing costs at minimum level.

In accordance with the first variant of the second embodiment the electric conductive protection layer remains between the top metal of the ASIC and the contacting metallization.

In accordance with the second variant of the second embodiment the contacts through the inter-metal dielectric layer have already been formed by means of so called plugs before the deposition of the permalloy material layer. These plugs can be protected in the same way during patterning of the permalloy material layer as the exposed top metal of the contact elements of the ASIC in the contact holes.

FIG. 3a shows a composite semiconductor arrangement 105, which represents the starting basis for the method for manufacturing a magnetic sensor module 300 according to the first variant of the second embodiment. This composite semiconductor arrangement 105, which has already been elucidated with reference to FIG. 1a, will for the sake of conciseness not be elucidated once again. Instead, reference is made to the description of FIG. 1a.

In a next processing state shown in FIG. 3b, recesses 326 for the contact elements 112 have been formed. The formation of these recesses 326 may be accomplished in a non depicted manner by (a) a deposition of a photoresist material on top of the second dielectric sub-layer 124, (b) a structuring of the deposited photoresist material, (c) an etching of the two dielectric sub-layers 122, 124, and (e) a stripping of the remaining photoresist material and a removal of sidewall polymers.

FIG. 3c shows a next processing state, wherein over the contact elements 112 and over the second dielectric sub-layer 124 in regions corresponding to the magnetic sensor elements 330 there has been formed a permalloy layer, which serves both as the material for the magnetic sensor elements 130 and as an electric conductive protection layer 340. The formation of this structured arrangement may be accomplished in a non depicted manner by (a) a deposition of the permalloy material, (b) a deposition of a photoresist material on top of the deposited permalloy material, (c) a structuring of the photoresist material in order to remove the permalloy material being located aside of the magnetic sensor elements 330 and the recesses 326, (d) an appropriate patterning of the permalloy material e.g. by means of a wet or a dry etching process, and (e) a stripping of the remaining photoresist material. It is mentioned that due to the protection of the contact elements 112 by means of the permalloy material 340 there will be no attack or damage of the contact elements 112 during the step (d).

Figure 3D:
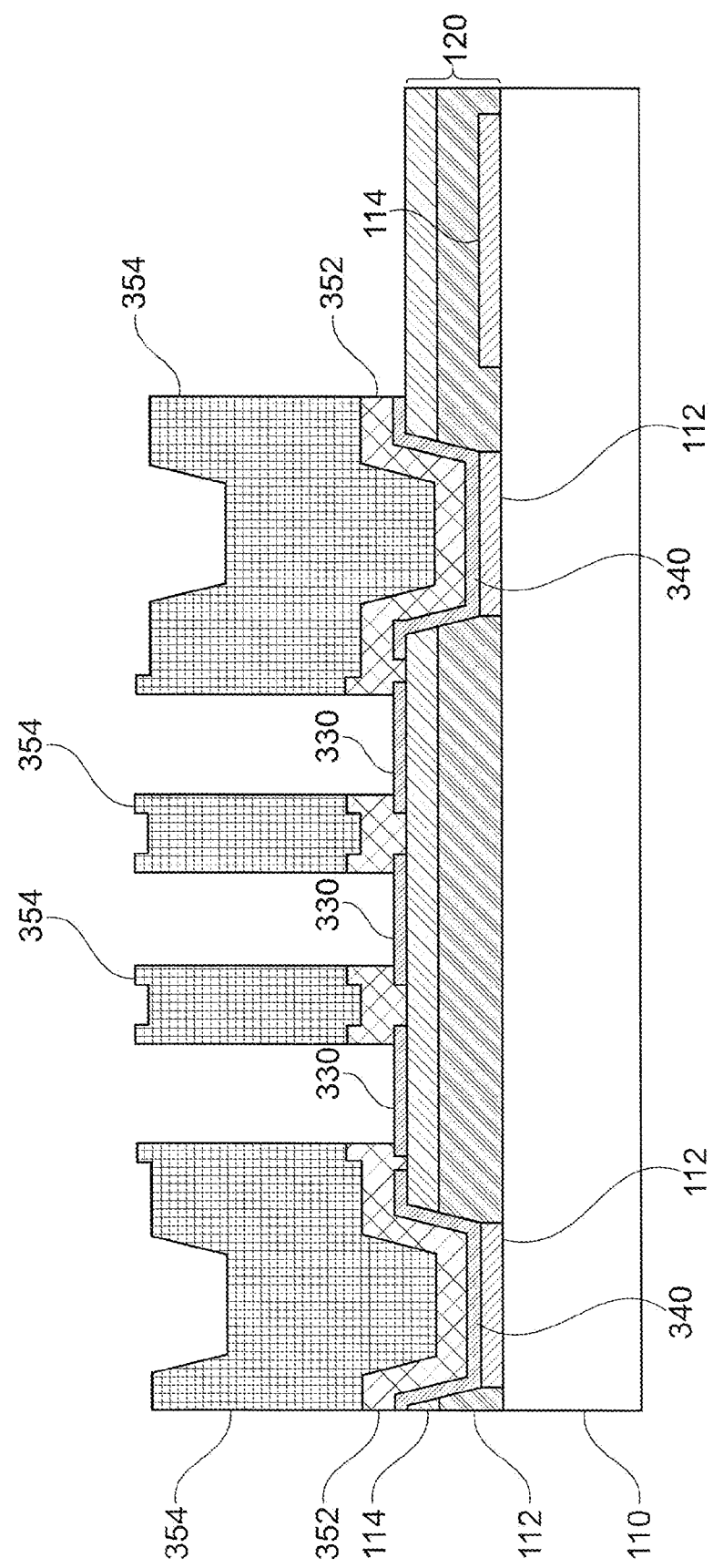

FIG. 3d shows a next processing state, wherein (i) over the contact elements 112 and (ii) over regions of the second dielectric sub-layer 124, which regions are located aside from the magnetic sensor elements 330, there has been formed first a metallic diffusion barrier layer 352 and a layer of contacting material 354. The formation of this structured arrangement may be accomplished in a non depicted manner by (a) a deposition of the diffusion barrier layer 352, (b) a deposition of the contacting material 354, (c) a deposition of a photoresist material on top of the contacting material 354, (d) an appropriate structuring of the photoresist material, (e) an etching of the contacting material 354, (f) a stripping of the remaining photoresist material, and (g) an etching of the diffusion barrier layer 352 e.g. by using the structured contacting material 354 as a hard-mask.

Figure 3E:
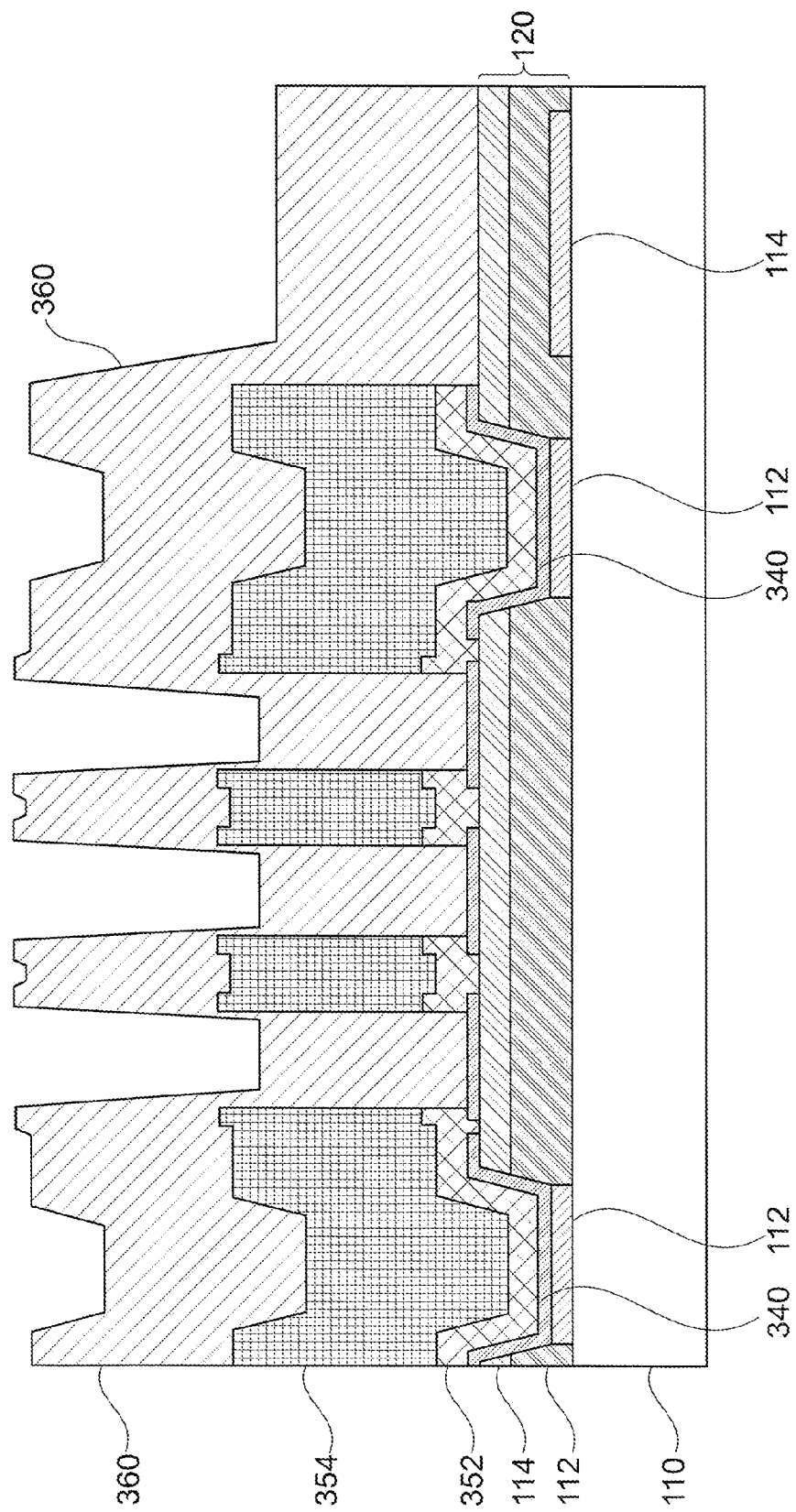

In a next processing state shown in FIG. 3e, a passivation layer 360 has been deposited. During, before and/or after the deposition of the passivation layer 360 the magnetic sensor elements 130 may be annealed. The passivation layer 360 may be formed in a known manner by means of e.g. a plasma deposition process.

Figure 3F:
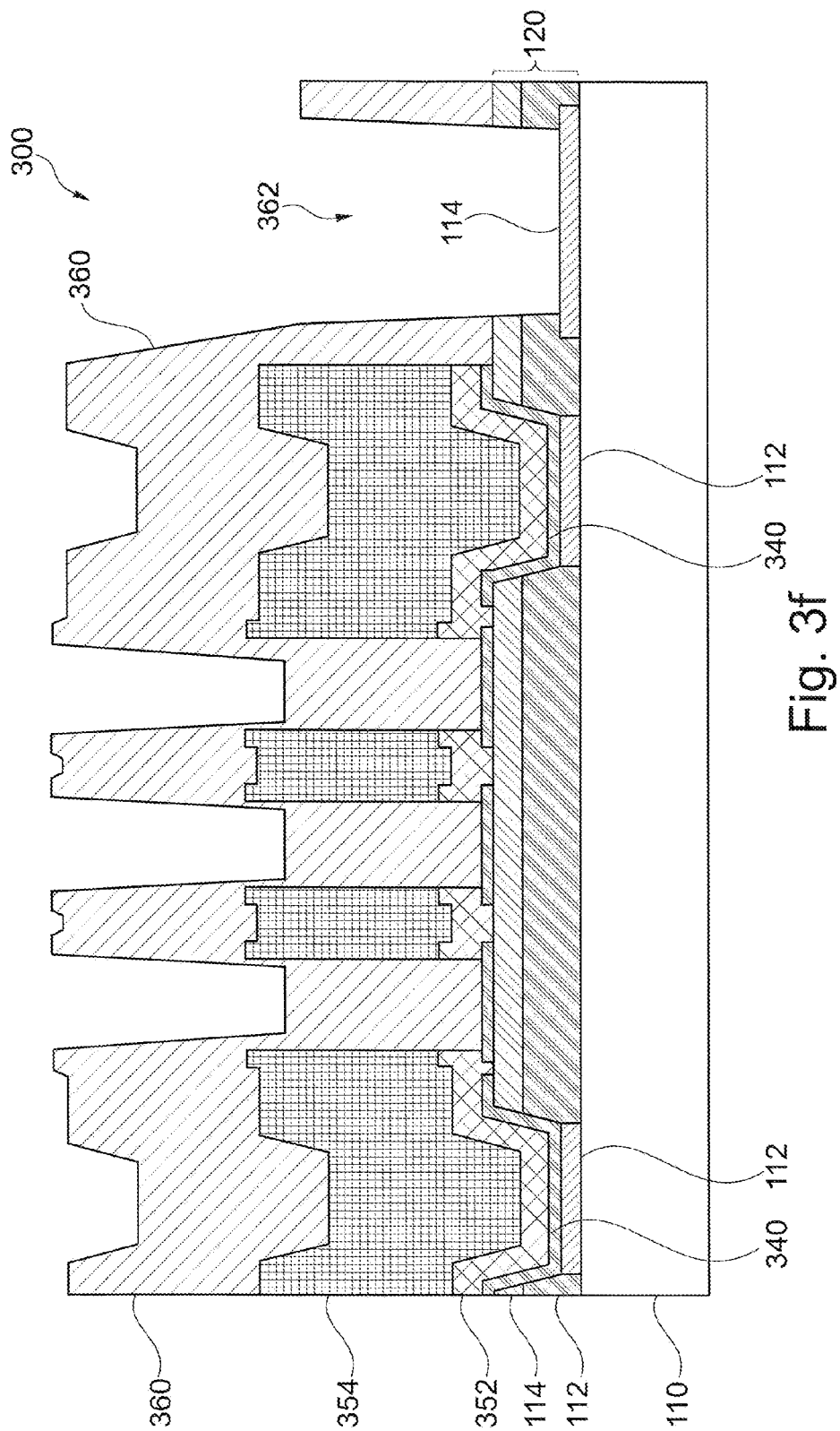

As can be seen from FIG. 3f, which shows the resulting magnetic sensor module 300, an opening or a recess 362 over the bond pad 114 has been formed. This opening or recess 362 allows the magnetic sensor module 300 to be electrically connected to other electronic devices e.g. by means of a bond wire. The formation of this opening or recess 362 may be accomplished in a non depicted manner by (a) a deposition of a photoresist material, (b) an appropriate structuring of the photoresist material, (c) an etching of the passivation layer 360 and the inter-metal dielectric layer 120, and (d) a stripping of the remaining photoresist material.

FIGS. 4a to 4f illustrate the manufacturing process of a magnetic sensor module in accordance with the second variant of the second embodiment.

FIG. 4a shows a composite semiconductor arrangement 105, which represents the starting basis for the method for manufacturing a magnetic sensor module 400 according to the second variant of the second embodiment. This composite semiconductor arrangement 105 is the same as the one shown in FIG. 1a. Therefore, for the sake of conciseness the composite semiconductor arrangement 105 of FIG. 4a will not be elucidated once again. Instead, reference is made to the description of FIG. 1a.

In a next processing state shown in FIG. 4b, contact plugs 412a are formed over the upper surface of the contact elements 112. This causes effectively to raise or extend the contact elements 112 up to a height level corresponding to the upper surface of the second dielectric sub-layer 124. The plugs may be made in a known manner e.g. be filling corresponding vias with tungsten (W).

FIG. 4c shows a next processing state, wherein over the plugs 412a and over the second dielectric sub-layer 124 in regions corresponding to the magnetic sensor elements 430 there has been formed a permalloy layer, which serves both as the material for the magnetic sensor elements 430 and as an electric conductive protection layer 440 for the plugs 412a. The formation of this structured arrangement may be accomplished in a non depicted manner by (a) a deposition of the permalloy material, (b) a deposition of a photoresist material on top of the deposited permalloy material, (c) a structuring of the photoresist material in order to remove the permalloy material being located aside of the magnetic sensor elements 430 and aside of the plugs 412a, (d) an appropriate patterning of the permalloy material e.g. by means of a wet or a dry etching process, and (e) a stripping of the remaining photoresist material. It is mentioned that due to the protection of the plugs 412a by means of the permalloy material 440 there will be no attack or damage of the plugs 412a during the step (d).

Figure 4D:
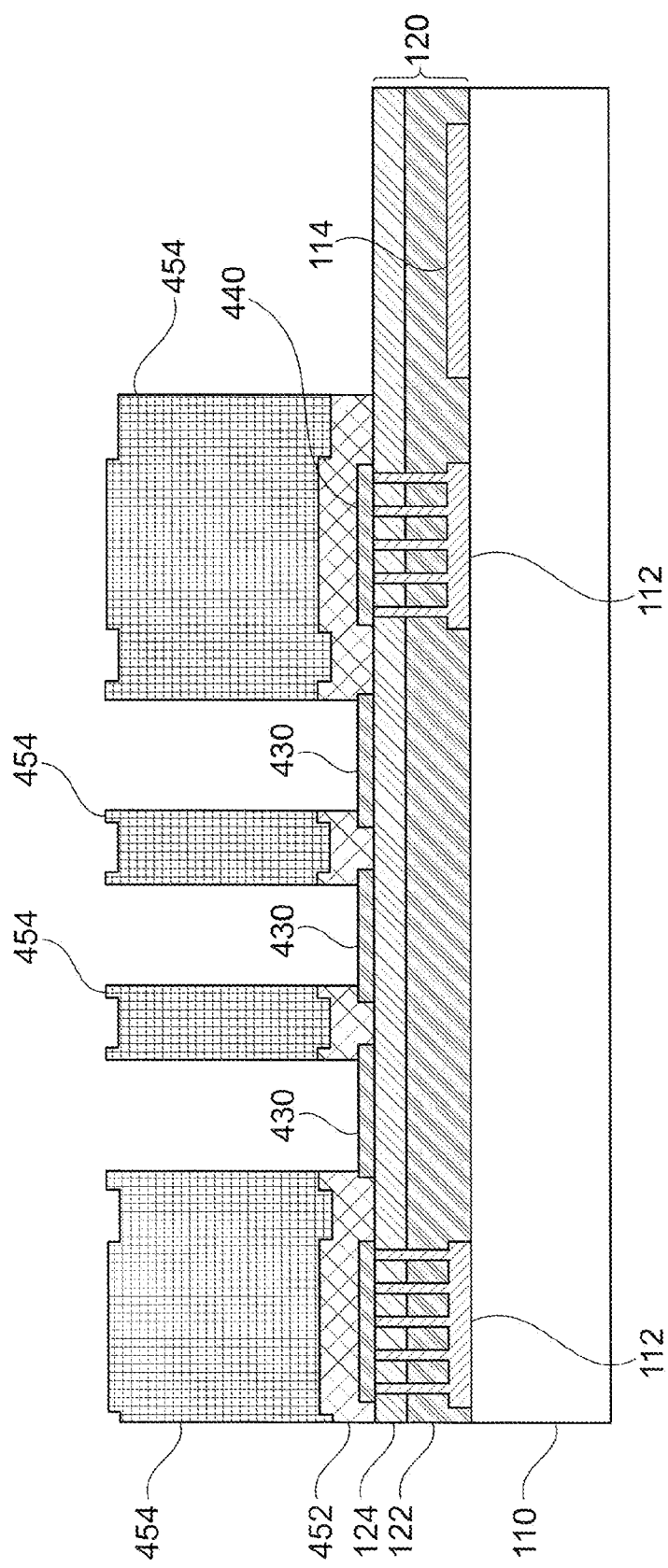

FIG. 4d shows a next processing state, wherein (i) over the plugs 412a and (ii) over regions of the second dielectric sub-layer 124, which regions are located aside from the magnetic sensor elements 430, there has been formed first a metallic diffusion barrier layer 452 and a layer of contacting material 454. The formation of this structured arrangement may be accomplished in a non depicted manner by (a) a deposition of the diffusion barrier layer 452, (b) a deposition of the contacting material 454, (c) a deposition of a photoresist material on top of the contacting material 454, (d) an appropriate structuring of the photoresist material, (e) an etching of the contacting material 454, (f) a stripping of the remaining photoresist material, and (g) an etching of the diffusion barrier layer 452 e.g. by using the structured contacting material 454 as a hard-mask.

Figure 4E:
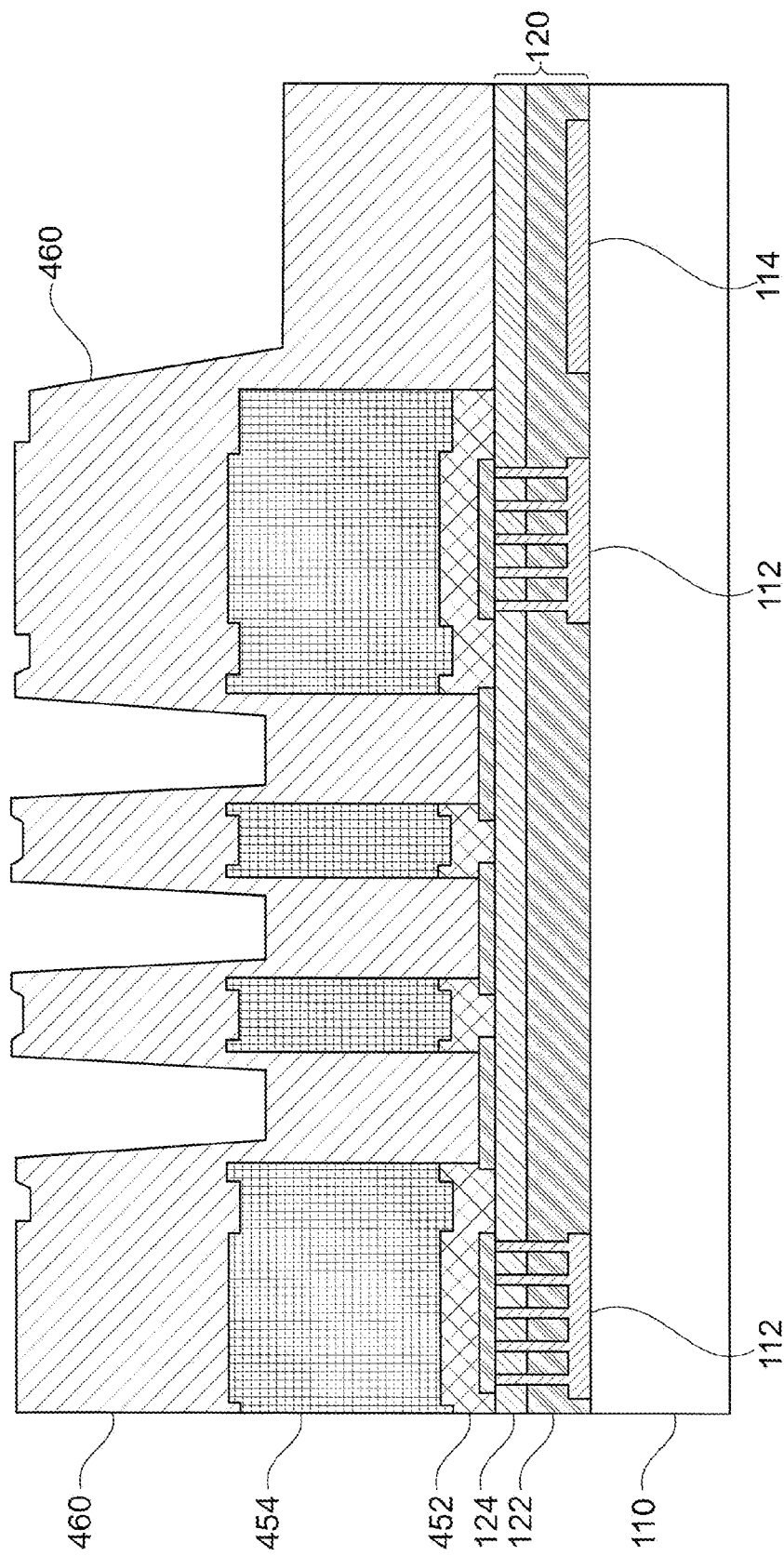

In a next processing state shown in FIG. 4e, a passivation layer 460 has been deposited. During, before and/or after the deposition of the passivation layer 460 the magnetic sensor elements 430 may be annealed. The passivation layer 460, which may be made of e.g. silicon nitride (SiN) or silicon oxy nitride (SiON), can be formed in a known manner by means of e.g. a plasma deposition process.

Figure 4F:
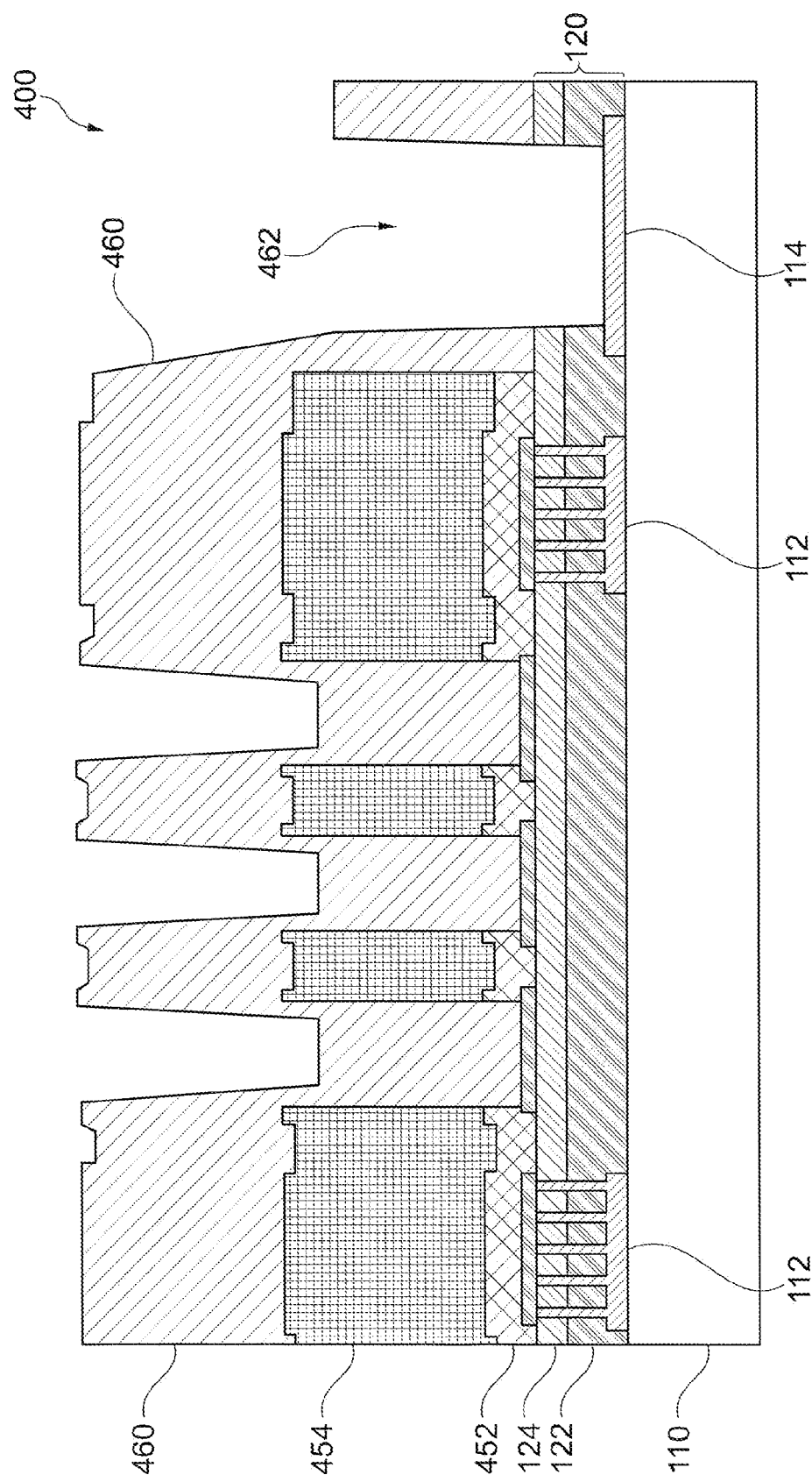

As can be seen from FIG. 4f, which shows the resulting magnetic sensor module 400, an opening or a recess 462 over the bond pad 114 has been formed. This opening or recess 462 allows the magnetic sensor module 400 to be electrically connected to other electronic devices e.g. by means of a bond wire. The formation of this opening or recess 462 may be accomplished in a non depicted manner by (a) a deposition of a photoresist material, (b) an appropriate structuring of the photoresist material, (c) an etching of the passivation layer 460 and the inter-metal dielectric layer 120, and (d) a stripping of the remaining photoresist material.

It is mentioned that on top of the structured passivation layer 460 a wafer-coating material which may act as a mechanical stress buffer can be deposited. This wafer-coating material, which must be removed above the bond pad 114, may be a photo-imide material. Before further processing the magnetic sensor module 400 e.g. by contacting the magnetic sensor module 400 with a bond wire the wafer-coating material may be cured by an appropriate thermal treatment. It is pointed out that such a wafer-coating material can also be applied to the passivation layers 160, 260, and 360, which are shown in FIGS. 1g, 2g, and 3f, respectively.

In order to recapitulate the above described embodiments of the present invention one can state:

In this document there is described a protection layer either for the material of the magnetic sensor elements or for the contacts elements to an ASIC in order to allow for monolithic integration of the magnetic sensor elements e.g. with a CMOS process. In accordance with variants of a first embodiment of the invention the protection layer is conductive and requires no extra mask layer thereby keeping process complexity and manufacturing cost at minimum level. This protection layer increase the process robustness and yield because it protects the magnetic sensor elements during formation and filling of the recesses which are required for connecting the arrangement comprising preferably four magnetic sensor elements (in particular in a Wheatstone configuration) to the ASIC located below in an active semiconductor chip. The protection layer is removed above the active magnetic sensor elements later in the process directly before a passivation layer is deposited thereby ensuring maximum protection of the crucial (permalloy) material of the magnetic sensor elements. The protection layer remains only in the contact regions.

In accordance with variants of a second embodiment of the invention the formation of the recesses is accomplished before the deposition of the crucial (permalloy) material of the magnetic sensor elements. By using a protection layer for the recesses or for e.g. tungsten plugs the corresponding contacts are prevented from any damage during patterning of the magnetic sensor elements thereby increasing process robustness and yield. If the material of the magnetic sensor elements (e.g. permalloy) is also used for protection no additional manufacturing steps are required thus keeping process complexity and manufacturing costs at minimum level.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

REFERENCE NUMERALS 100 magnetic sensor module
105 composite semiconductor arrangement
110 semiconductor chip
112 contact elements
114 bond pad
120 dielectric layer
122 first dielectric sub-layer
124 second dielectric sub-layer
130 magnetic sensor elements
140 electric conductive protection layer
142 opening/recess for contact element
152 diffusion barrier layer
154 contacting material
160 passivation layer
162 opening/recess for bond pad
200 magnetic sensor module
226 opening/recess for contact element
240 electric conductive protection layer
252 barrier layer
254 contacting material
260 passivation layer
262 opening/recess for bond pad
300 magnetic sensor module
326 opening/recess for contact element
330 magnetic sensor elements
340 electric conductive protection layer
352 barrier layer
354 contacting material
360 passivation layer
362 opening/recess for bond pad
400 magnetic sensor module
412a vias, contact plugs
430 magnetic sensor elements
440 electric conductive protection layer
452 barrier layer
454 contacting material
460 passivation layer
462 opening/recess for bond pad

The invention claimed is:

1. A method for manufacturing a magnetic sensor module having magnetic sensor elements monolithically integrated at a semiconductor chip which comprises an integrated circuit, the method comprising
   providing a composite semiconductor arrangement comprising (i) the semiconductor chip, (ii) contact elements for the integrated circuit, which are formed on the semiconductor chip, and (iii) a dielectric layer formed over the semiconductor chip and over the contact elements,
   forming a magnetic sensor layer by providing the material for the magnetic sensor elements monolithically over the dielectric layer,
   exposing the contact elements by removing a part of the dielectric layer which part is located above the contact elements, and
   forming an electric conductive protection layer over either the formed magnetic sensor layer or the exposed contact elements in order to prevent negative interactions between (i) the step of forming the magnetic sensor elements resulting from the magnetic sensor layer and (ii) the step of exposing the contacting elements.

2. The method as set forth in claim 1, wherein the dielectric layer comprises
   a first dielectric sub-layer formed over the semiconductor chip and
   a second dielectric sub-layer formed over the first dielectric sub-layer.

3. The method as set forth in claim 1, further comprising
   forming, in the regions above the exposed contact elements, an electric conductive barrier layer over the exposed contact elements and
   forming, in the regions above the exposed contact elements, a contacting material over the electric conductive barrier layer.

4. The method as set forth in claim 1, further comprising
   forming, over the magnetic sensor elements and the contacting material, a nonmetallic passivation layer.

5. The method as set forth in claim 1, further comprising
   exposing a bond pad which is provided at the surface of the semiconductor chip by removing, in the region above the bond pad, the passivation layer and the dielectric layer.

6. The method as set forth in claim 1, wherein
   the electric conductive protection layer comprises at least one material of the group consisting of TiW, TiWN, Ta, TaN, Ti, TiN, W, WN, or NiFe.

7. The method as set forth in claim 1, wherein
   the step of forming the magnetic sensor layer is accomplished before the step of exposing the contact elements and wherein
   the electric conductive protection layer is formed over the formed magnetic sensor layer.

8. The method as set forth in claim 7, further comprising
   forming the magnetic sensor elements by structuring the magnetic sensor layer,
   wherein
   the electric conductive protection layer is formed over the formed magnetic sensor elements and over the contact elements and wherein the step of exposing the contact elements comprises removing, in the region above the contact elements, both the dielectric layer and the electric conductive protection layer.

9. The method as set forth in claim 7, wherein
before exposing the contact elements the electric conductive protection layer is structured by removing the electric conductive protection layer in all regions except the regions above the areas in which the magnetic sensor elements have been formed or will be formed.

10. The method as set forth in claim 9, wherein
the electric conductive protection layer is formed over the formed magnetic sensor layer, which has not yet been structured in order to form the magnetic sensor elements, and
the structured electric conductive protection layer is used as a hardmask for removing the magnetic sensor layer outside the areas of the magnetic sensor elements.

11. The method as set forth in claim 1, wherein
the step of exposing the contact elements is accomplished before the step of forming the magnetic sensor elements and wherein
the electric conductive protection layer is formed over the exposed contact elements.

12. The method as set forth in claim 11, wherein
the material of the electric conductive protection layer is the same as the material of the magnetic sensor elements.

13. The method as set forth in claim 11, wherein
the step of exposing the contact elements is accomplished by removing, in the regions above the contact elements, the dielectric layer.

14. The method as set forth in claim 11, wherein
the step of exposing the contact elements is accomplished by forming, in the regions above the contact elements, vias through the dielectric layer and filling the vias with a conductive material.

15. A magnetic sensor module comprising
a semiconductor chip which accommodates an integrated circuit,
contact elements for the integrated circuit, which are formed on the semiconductor chip,
a dielectric layer formed over the semiconductor chip at least at regions being located outside from regions being located above the contact elements, and
magnetic sensor elements which are formed monolithically integrated over the dielectric layer,
wherein the magnetic sensor module is manufactured by a method as set forth in any one of the preceding claims.

* * * * *